(12) United States Patent  
Kojima et al.

(10) Patent No.: US 8,432,646 B2  
(45) Date of Patent: Apr. 30, 2013

(54) MAGNETIC DETECTION ELEMENT

(75) Inventors: Shuuichi Kojima, Kanagawa (JP);  
Satoru Okamoto, Kanagawa (JP);  
Nobuo Yoshida, Kanagawa (JP);  
Katsuro Watanabe, Ibaraki (JP)

(73) Assignee: HGST Netherlands B.V., Amsterdam (NL)

( * ) Notice: Subject to any disclaimer, the term of this patent is extended or adjusted under 35 U.S.C. 154(b) by 1468 days.

(21) Appl. No.: 12/012,635

(22) Filed: Feb. 4, 2008

(65) Prior Publication Data

US 2008/0218910 A1 Sep. 11, 2008

(30) Foreign Application Priority Data

Feb. 2, 2007 (JP) ................. 2007-024597

(51) Int. Cl.  
*G11B 5/33* (2006.01)

(52) U.S. Cl.  
USPC ....................................... 360/324.12

(58) Field of Classification Search ............... 360/324.1  
See application file for complete search history.

(56) References Cited

U.S. PATENT DOCUMENTS

| 5,668,688 | A | 9/1997 | Dykes et al. |
| 7,193,821 | B2 | 3/2007 | Miyauchi |
| 2006/0056117 | A1 | 3/2006 | Miyauchi et al. |
| 2008/0253036 | A1* | 10/2008 | Kagami et al. ............... 360/319 |

FOREIGN PATENT DOCUMENTS

| JP | 03-154217 A | 7/1991 |
| JP | 3154217 A | 7/1991 |
| JP | 2001-229514 A | 8/2001 |
| WO | 9744781 A1 | 11/1997 |

* cited by examiner

Primary Examiner — David D Davis  
(74) Attorney, Agent, or Firm — Zilka-Kotab, PC

(57) ABSTRACT

Embodiments of the present invention help to reduce etching damage at end parts of a magnetoresistive sensor in ion beam etching. According to one embodiment, ion beam etching (IBE) is used in a magnetoresistive sensor track width forming step. This IBE irradiates Ar ion beam to a substrate in a state that the substrate is inclined and further rotates the substrate about its normal as a rotational axis. In a conventional track width forming step, the IBE irradiates the Ar ion beam to the substrate all the time while the IBE is rotating the substrate. By contrast, the IBE according to embodiments of the present invention irradiates the Ar ion beam to the substrate only in a predetermined specific angular range.

11 Claims, 17 Drawing Sheets

MAGNETIC DETECTION ELEMENT

CROSS-REFERENCE TO RELATED APPLICATION

The instant nonprovisional patent application claims priority to Japanese Patent Application No. 2007-024597 filed Feb. 2, 2007 and which is incorporated by reference in its entirety herein for all purposes.

BACKGROUND OF THE INVENTION

A hard disk drive (HDD) is equipped with a magnetic recording medium and a magnetic head; the magnetic head reads and writes data on the magnetic recording medium. The magnetic head in the HDD is constituted by a recording head for recording information on the magnetic recording medium (magnetic disk) as magnetic signals and a reproducing head for reading out signals recorded on the magnetic recording medium as magnetic signals. The reproducing head includes a magnetoresistive effect stacked body consisted of a plurality of magnetic thin films and non-magnetic thin films and is called a magnetoresistive effect head because it reads signals by utilizing magnetoresistive effect.

There have been various types of stacking structures for magnetoresistive effect heads, and the heads are classified into categories such as an AMR head, a GMR head, a CPP-GMR head, and a TMR head in accordance with the principle of the magnetic resistance used therein. They use a magnetoresistive effect (AMR), a giant magnetoresistive effect (GMR), a current perpendicular plane GMR effect (CPP-GMR effect), a tunnel magnetoresistive effect (TMR), respectively, and retrieve input magnetic fields entering the reproducing head from the magnetic recording medium as voltage changes.

Currently, development in high sensitivity has required a reproducing scheme with higher sensitivity. In the range of 70 to 150 (Gb/in.$^2$), the TMR head which has a very high MR ratio is advantageous in view of improvement of sensitivity. The TMR head is disclosed in Japanese Patent Publication No. 3-154217 ("Patent Document 1"), for example.

For ultra high recording density exceeding 150 (Gb/in.$^2$), the CPP-GMR head or the like may be preferred. The CPP-GMR is disclosed in Japanese Unexamined Patent Application No. 11-509956 ("Patent Document 2"), for example. Being different from the current in plane GMR (CIP-GMR) in which sense current flows parallel to film planes of the magnetoresistive effect stacked body, the TMR and the CPP-GMR are schemes in which the sense current flows perpendicular to the film planes, i.e., in the direction of stacking the film planes. In the present specification, the scheme like this is referred to as a CPP scheme; and the reproducing head like this, a CPP reproducing head.

FIG. 17(a) is a cross-sectional view schematically showing a configuration of the CPP reproducing head 71. The magnetoresistive sensor 712 is provided between a lower shield 711 and an upper shield 713. The lower shield 711 and the upper shield 713 function as magnetic shields and a lower electrode and an upper electrode respectively as well for supplying the magnetoresistive sensor 712 with sense current. Under the upper shield 713, an upper magnetic isolation film 714 made of a conductor is provided.

As shown in FIG. 17(b), the magnetoresistive sensor 712 includes a sensor underlayer 271, an antiferromagnetic film 272, a fixed layer 273, a non-magnetic intermediate layer 274, a free layer 275, and a sensor cap film 276 sequentially stacked from the lower layer side. Exchange interaction with the antiferromagnetic film 272 works on the fixed layer 273 so that the magnetization direction is fixed. If the reproducing head 71 is a TMR head, the non-magnetic intermediate layer 274 is formed of an insulator such as alumina ($AL_2O_3$) or magnesium oxide (MgO). If a CPP-GMR is used, the non-magnetic intermediate layer 274 is formed of a non-magnetic conductor such as a Cu alloy. The track width of the free layer 275 is denoted by Twf.

If the relative magnetization direction of the free layer 275 to the magnetization direction of the fixed layer 273 changes due to the magnetic field from the magnetic disk, the resistance (current value) of the magnetoresistive sensor 712 changes. Thereby, the reproducing head 71 can detect an external magnetic field. On the right and left of the magnetoresistive sensor 712, hard bias films 715 are provided. The bias fields from the hard bias films 715 act on the free layer 275 to have a single magnetic domain. The hard bias film 715 is formed on the hard bias underlayer film 716. As a lower layer of the hard bias underlayer film 716, a junction insulating film 717 is formed. The insulating film 717 is provided between the hard bias underlayer film 716 and a lower shield film 711 and the magnetoresistive sensor 712 and works for the sense current not to flow outside of the magnetoresistive sensor 712.

Next, manufacturing steps of the CPP reproducing head 71 will be described. First, a multilayer film constituting the magnetoresistive sensor 712 is deposited and formed by sputtering. Then, a resist is formed by resist coating and patterning and a track width of the multilayer film magnetoresistive sensor 712 is formed by etching using ion milling. Then, the insulating film 717 is formed. Furthermore, the hard bias underlayer film 716 and the hard bias film 715 are formed. Then, the resist is lifted off and the upper magnetic isolation film 714 and the upper shield film 713 are formed.

In the above etching step of the magnetoresistive sensor 712, the side ends of the magnetoresistive sensor 712 are exposed to etching particles. At this time, an etching damaged layer 781 is formed on the exposed surfaces as shown in FIG. 17(b). It has now been revealed that the etching damaged layer 781 formed on the end of the magnetoresistive sensor 712 in this etching step impairs characteristics and reliability of the magnetoresistive sensor 712. Specifically, it has now been revealed that shunt current flowing in the etching damaged layer 781 becomes a significant problem. Therefore, it is required to suppress the etching damages in the etching step of the magnetoresistive sensor 712.

In the CPP reproducing head 71, thicknesses and shapes of the respective layers in vicinity of the end of the magnetoresistive sensor 712 are important as well as the insulating voltage-resistant characteristic of the insulating film 717. For example, the hard bias film 715 having a conventional structure shown in FIG. 17(a) is formed thicker near the side end of the magnetoresistive sensor 712 and the film thickness gradually increases from near the end of the magnetoresistive sensor 712. Thus, near the side end of the magnetoresistive sensor 712, a large level difference Ush is formed on the upper shield 713 and the upper shield 713 has a shape having a deep depressed part on the magnetoresistive sensor 712.

This results in upper shield 713 not being flattened, or that the flattened width becomes smaller on the magnetoresistive sensor 712. If the flattening of the upper shield 713 is not enough for the track width Twf of the free layer like this, a problem occurs in that the effect of the upper shield 713 at the end of the magnetoresistive sensor 712 is reduced so that a spread width in reading increases. In particular, this problem is obvious in a reproducing head with a small shield space Gs.

BRIEF SUMMARY OF THE INVENTION

Embodiments of the present invention help to reduce etching damage at end parts of a magnetoresistive sensor in ion beam etching. According to the particular embodiment of FIGS. 3-4, ion beam etching (IBE) is used in a magnetoresistive sensor 112 track width forming step (S12). This IBE irradiates Ar ion beam to a substrate 51 in a state that the substrate 51 is inclined and further rotates the substrate about its normal as a rotational axis. In a conventional track width forming step, the IBE irradiates the Ar ion beam to the substrate 51 all the time while the IBE is rotating the substrate 51. By contrast, the IBE in embodiments of the present invention irradiates the Ar ion beam to the substrate 51 only in a predetermined specific angular range.

DETAILED DESCRIPTION OF THE INVENTION

Figure 1:
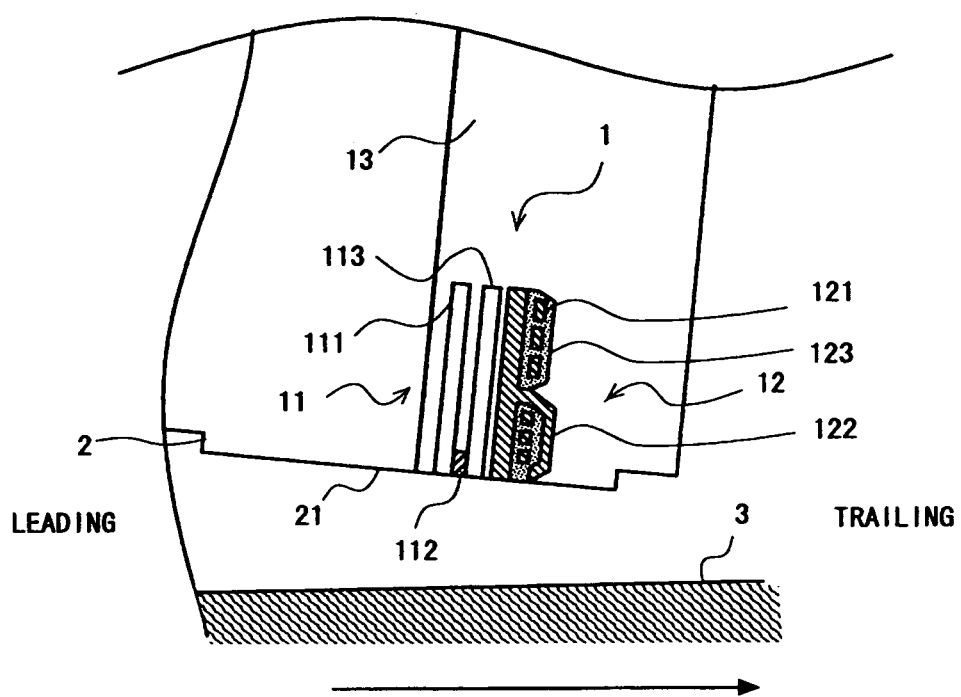
FIG. 1 is a cross-sectional view schematically showing the configuration of the magnetic head according to one embodiment.

Embodiments of the present invention relate to a magnetic detection element and a manufacturing method thereof, more particularly, to a magnetic detection element in which sense current flows in a stacking direction of a magnetoresistive sensor multilayer film and a manufacturing method thereof.

An aspect of embodiments of the present invention is a magnetic detection element including a magnetoresistive sensor multilayer film having a fixed layer whose magnetization direction is fixed, a free layer whose magnetization direction is changed in accordance with an external magnetic field, and a non-magnetic intermediate layer between the fixed layer and the free layer; current flowing in a perpendicular direction to a plane of the magnetoresistive sensor multilayer film. The element comprises an upper shield electrode and a lower shield electrode formed so as to sandwich the magnetoresistive sensor multilayer film in the top-bottom direction, magnetic domain control films formed at both sides of the magnetoresistive sensor multilayer film for applying bias fields to the free layer, a sensor multilayer film lower layer formed lower than the fixed layer, the free layer, and the non-magnetic intermediate layer and having level differences, thicknesses thereof becoming smaller as getting away from the magnetoresistive sensor multilayer film, and insulating films formed in contact with the both side ends of the magnetoresistive sensor multilayer film having level differences such that thicknesses of the insulating films are formed thinner on the magnetoresistive sensor multilayer film side in accordance with the level differences of the sensor multilayer film lower layer. This structure of the insulting film enables to adjust the shapes of the respective layers in the vicinity of the sensor and realize a reproducing head exhibiting a high reliability in dielectric strength.

Angles of end parts of the fixed layer, the free layer, and the non-magnetic intermediate layer may preferably be not less than 45°. This helps to provide the free layer with a bias field effectively. It may be preferable that the upper shield electrode is substantially flat in a region overlapping the magnetoresistive sensor multilayer film and a width of the substantially flat region is not less than a sum of a track width of the free layer and a value twice as a space between the upper shield electrode and the lower shield electrode. This improves the reading characteristics.

The fixed layer, the non-magnetic intermediate layer, and the free layer may be sequentially stacked and arranged in order from the lower side to the upper side, the magnetic domain control film has a level difference such that thickness thereof is formed thinner at the magnetoresistive sensor multilayer film side, and the level position of the top surface of the magnetic domain control film in a vicinity of a side end of the magnetoresistive sensor multilayer film is lower than the top surface position of the magnetoresistive sensor multilayer film by not more than 5 nm. This enables to provide the free layer with a bias field effectively and to improve magnetic stability in the hard bias film.

The magnetic domain control film may have a level difference such that thickness thereof is formed thinner at the magnetoresistive sensor multilayer film side, and in the level difference of the magnetic domain control film, the thickness at the magnetoresistive sensor multilayer film side may be one-half of the thickness of an opposite side of the magnetoresistive sensor multilayer film side.

Another aspect of embodiments of the present invention is a method for manufacturing a magnetic detection element including a magnetoresistive sensor multilayer film having a fixed layer whose magnetization direction is fixed, a free layer whose magnetization direction is changed in accordance with an external magnetic field, and a non-magnetic intermediate layer between the fixed layer and the free layer; current flowing in a perpendicular direction to a plane of the magnetoresistive sensor multilayer film. This method forms a multilayer film on a substrate, deposits a patterned photoresist on the multilayer film, etches by irradiating etching particles to the multilayer film at an inclined angle to the substrate in a state that the photoresist has been deposited, and forms side end shapes of the magnetoresistive sensor multilayer film. The etching irradiates etching particles to the multilayer film while changing an incident angle within a predetermined limited incident angle range to the photoresist. This reduces etching damage to the magnetoresistive sensor and achieves an effective shape control.

The etching may irradiate the etching particles to the multilayer film at a timing corresponding to the predetermined limited incident angular range while rotating the substrate with the inclination angle. This achieves an easy and effective process.

The method may form insulating films on side ends of the magnetoresistive sensor multilayer film and magnetic domain control films on sides of the insulating films opposite to the magnetoresistive sensor multilayer film. The respective forming of the insulating films and the magnetic domain control films preferably irradiate material particles to the substrate at an inclined angle to the substrate and irradiate the material particles while changing an incident angle within a predetermined and limited incident angle range to the photoresist. This achieves an effective shape control in forming films.

Moreover, the respective forming the insulating films and the magnetic domain control films may rotate the substrate with the inclination angle and irradiate the material particles at a timing corresponding to the predetermined and limited incident angular range. Or, the inclination angle and the incident angular range in the forming of the insulating films may be set so that the top surfaces of the insulating films are flattened based on the inclination angle and the incident angular range in the etching.

Embodiments of the present invention help to suppress deterioration of element characteristic in a magnetoresistive detection element having a magnetoresistive sensor multilayer film in which sense current flows in a stacking direction.

Hereinafter, certain embodiments of the present invention are described referring to the drawings. Throughout the drawings, the like components are denoted by like reference numerals, and their repetitive description is omitted if not necessary for the sake of clearness in the explanation. In the particular embodiments described hereinbelow, the present invention is applied to a reproducing head for a hard disk drive (HDD) as an example of a magnetic detection element. The reproducing head according to one embodiment is a current perpendicular plane (CPP) head in which sense current flows in the stacking direction of the magnetoresistive sensor multilayer film (perpendicular to the plane).

Before describing a feature of an embodiment, the entire configuration of the magnetic head will be outlined. FIG. 1 is a cross-sectional view schematically showing the configuration of the magnetic head 1. The magnetic head 1 reads and writes data from and to the magnetic disk 3. In FIG. 1, the magnetic disk 3 is rotating to the right and the traveling direction of the magnetic head 1 is the left in FIG. 1. The magnetic head 1 is equipped with a reproducing head 11 and a recording head 12 arranged in order from its traveling direction side (leading side). The magnetic head 1 is formed on the trailing side (the other side of the leading side) of a slider 2. The magnetic head 1 and the slider 2 constitute a head slider. The reproducing head 111 contains a lower shield 111, a magnetoresistive sensor 112, and an upper shield 113 in order from the leading side. The recording head 12 contains a thin film coil 121 and recording magnetic poles 122. The thin film coil 121 is enclosed with an insulator 123.

The recording head 12 is an inductive element for generating magnetic fields between recording magnetic poles 122 from electric current running through the thin film coil 121 and for recording magnetic data onto the magnetic disk 11. The reproducing head 11 is a magnetoresistive element and contains a magnetoresistive sensor 112 having magnetic anisotropy and reads out magnetic data recorded on the magnetic disk 3 by use of resistance which changes in accordance with the magnetic fields from the magnetic disk 2. The reproducing head of the present embodiment is a CPP reproducing head and the lower shield 111 and the upper shield 113 are used as electrodes for supplying the magnetoresistive sensor 112 with the detection current.

The magnetic head 1 is formed on an AlTiC substrate constituting the slider 2 by using a thin film forming process. The magnetic head 1 and the slider 2 constitute a head slider. The head slider flies over the magnetic disk 3 and the surface 21 facing the magnetic disk is called an air bearing surface (ABS). The magnetic head 1 is equipped with a protective film 13 made of such as alumina around the recording head 12 and the reproducing head 11, and the entire magnetic head 1 is protected by the protective film 13.

Figure 2:
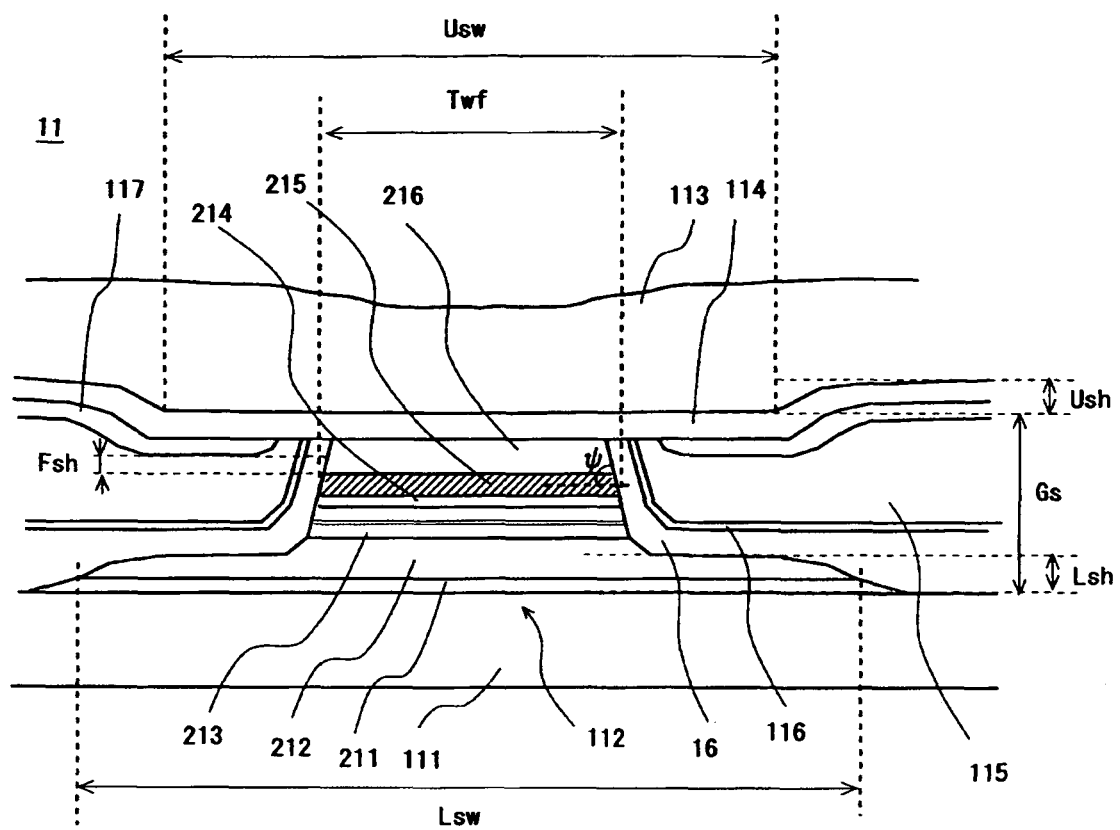
FIG. 2 is a cross-sectional view schematically showing the configuration of the reproducing head according to one embodiment.

FIG. 2 is a cross-sectional view schematically showing a configuration of the reproducing head 11 of the present embodiment by way of example of a magnetoresistive detecting element. FIG. 2 schematically shows its cross-sectional structure as viewed from the ABS 21 of the head slider, i.e., the flying surface facing the magnetic disk 3. The bottom of FIG. 2 is the leading side and the top is the trailing side. In the present specification, the AlTiC substrate side on which the reproducing head 11 is formed, i.e., the slider 2 side, is defined as the bottom and the opposite trailing side is defined as the top. Each layer of the reproducing head 11 is formed sequentially from the bottom. The reproducing head 11 of the present embodiment is a CPP reproducing head such as a tunneling magnetoresistive (TMR) head or a current-perpendicular-plane-magnetoresistive (CPP-MR) head and sense current flows in the top-bottom direction in FIG. 2.

The magnetoresistive sensor 112 is provided between the lower shield 111 and the upper shield 113. The distance between the top surface of the lower shield 111 and the under surface of the upper shield 113 is denoted by a shield space Gs. The lower shield 111 and the upper shield 113 are formed of conductive magnetic material and function as magnetic shields, and a lower electrode and an upper electrode respectively for supplying sense current to the magnetoresistive sensor 112. The lower shield 111 and the upper shield 113 are made of an alloy containing such as Ni, Fe, Co, or the like. Under the upper shield 113, an upper magnetic isolation film 114 made of a conductor is formed.

The magnetoresistive sensor 112 is a stacked body having a plurality of layers. The magnetoresistive sensor 112 comprises a sensor underlayer 211, an antiferromagnetic film 212, a fixed layer 213, a non-magnetic intermediate layer 214, a free layer 215, and a sensor cap film 216 stacked sequentially from the lower layer. The respective layers physically contact the adjacent layers.

The sensor underlayer 211 is made of non-magnetic material such as Ta and a NiFeCo alloy, and may be a single layer structure as shown in the drawing or a stacked structure. The antiferromagnetic film 212 is made of antiferromagnetic material such as PtMn. The fixed layer 213 in FIG. 2 is a stacked fixed layer and is constituted by two ferromagnetic films formed of such as a CoFe alloy and a non-magnetic layer therebetween made of such as Ru. The two ferromagnetic films are coupled by exchange interaction and fixed magnetization is stabilized. The magnetizing direction of the lower ferromagnetic film is fixed by the exchange interaction with the antiferromagnetic film 212. The fixed layer 213 may be a single layer structure.

If the reproducing head 11 is a TMR head, the non-magnetic intermediate layer 214 is made of an insulator such as magnesium oxide (MgO) and functions as a tunnel barrier. On the other hand, if the reproducing head 11 utilizes the CPP-GMR, the non-magnetic intermediate layer 214 is formed by using a non-magnetic conductor such as Cu. The free layer 215 is formed of a magnetic metal substance such as a NiFe alloy or a CoFe alloy. The free layer 215 may be a single layer or a stacked structure. The track width of the free layer 215 is denoted by Twf. The sensor cap film 216 is made of a non-magnetic conductor such as Ta.

When the relative magnetizing direction of the free layer 215 with respect to the magnetizing direction of the fixed layer 213 changes in accordance with the magnetic field from the magnetic disk 3, the resistance (current value) of the magnetoresistive sensor 112 changes. The reproducing head 11 thereby can detect an external magnetic field. In order to suppress such as Barkhausen noise caused by non-uniform magnetic domains of the free layer 215, hard bias films 115 which are magnetic domain control films are provided at the right and left sides of the magnetoresistive sensor 112. A bias field from the hard bias film 115 controls the magnetic domains of the free layer 215 and acts on the free layer 215 to have a single magnetic domain. The hard bias film 115 is formed in contact with and above the hard bias underlayer film 116. On the hard bias film 115, a hard bias protective film 117 is formed.

The reproducing head 11 has junction insulating films 16 between the magnetoresistive sensor 112 and the hard bias films 115 on both the left and right of the track width direction of the magnetoresistive sensor 112 (the left-right direction in FIG. 2). The junction insulating film 16 may be made of $Al_2O_3$, for example. The junction insulating film 16 insulates the upper shield film 113 and the lower shield film 111 from each other outside the magnetoresistive sensor 112 and blocks off sense current outside the magnetoresistive sensor 112.

The hard bias film 115 is made of such as a CoCrPt alloy or a CoPt alloy and is conductive. The hard bias underlayer film 116 is made of such as Cr. Therefore, the junction insulating film 16 prevents the sense current from flowing between the upper shield film 113 and the lower shield film 111 not through the non-magnetic intermediate layer 214 but through the hard bias film 115, so that necessary output from the magnetoresistive sensor 112 is achieved.

The magnetoresistive sensor 112 according to the present embodiment has a level difference on its lower layer side such that the thickness of the lower layer becomes smaller as it gets away from the magnetoresistive sensor multilayer film. As shown in FIG. 2, lower layers lower than the fixed layer 213, specifically a part of the antiferromagnetic film 212 and a part of the sensor underlayer 211 beneath it, remain without being etched. These lower layers extend outward in the track width direction further than the respective side edges of the fixed layer 213, the non-magnetic intermediate layer 214 and the free layer 215, and their width Lsw is larger than the ones of the above-described fixed layer 213, non-magnetic intermediate layer 214, and the free layer 215. Namely, the antiferromagnetic film 212, which is the adjacent lower layer of the fixed layer 213, and the sensor underlayer 211 beneath it extend both rightward and leftward further than the respective side ends of the fixed layer 213, the non-magnetic intermediate layer 214, and the free layer 215. The distance between the level difference portion and the end of the magnetoresistive sensor 112 is approximately 0.05 to 0.2 μm.

The antiferromagnetic layer 212 is partially etched on its outer sides and the thicknesses of the outer sides are smaller than the one of the region overlapping the fixed layer 213. The antiferromagnetic layer 212 has an end part whose thickness gradually decreases, then continues to be substantially the same, and again gradually decreases, as it gets away from the side end of the magnetoresistive sensor 112 which conforms to the side end of the free layer 215. The end of the sensor underlayer 211 is conformed to the end of the antiferromagnetic layer 212 at the position in the track width direction.

The junction insulating film 16 has a thickness corresponding to the level difference of the antiferromagnetic layer 212 and the sensor underlayer 211 (dimension in the vertical direction). Specifically, the thickness of a part on the antiferromagnetic layer 212 is thinner than the one of a part outside of the antiferromagnetic layer 212. For example, in the junction insulating film 16, the thickness of the part which is outside of the antiferromagnetic layer 212 and is formed in touch with the lower shield film 111 can be made twice as the thickness of the part which is in the vicinity of the magnetoresistive sensor 112 and its thickness is substantially constant. Thus, the junction insulating film 16 can be thinned in the part of the width Lsw in the vicinity of the magnetoresistive sensor 112, and can be thicker in the part of a certain width on the outer side thereof. Therefore, the shapes of the respective layers in the vicinity of the magnetoresistive sensor 112 can be adjusted and a reproducing head with high reliability in dielectric strength can be realized.

The under surface of the junction insulating film 16 has an outline corresponding to the outlines of the antiferromagnetic layer 212 and the sensor underlayer 211. Specifically, the under surface of the junction insulating film 16 has a level difference Lsh corresponding to the level difference of the antiferromagnetic layer 212 and the sensor underlayer 211. Thereby, the top surface of the junction insulating film 16 is substantially flat. Flattening the top surface of the junction insulating film 16 enables to deposit the hard bias underlayer film 116 to be deposited thereon more uniformly and to uniform the under surface of the hard bias film 115, which contribute to the characteristic improvement of the hard bias film 115.

The hard bias film 115 of the present embodiment has two levels of steps in the track width direction and the level difference is formed on the top surface thereof. Specifically, the hard bias film 115 is thinned in the vicinity of the magnetoresistive sensor 112 and is formed thicker in its far side from the magnetoresistive sensor 112. In the hard bias film 115, its film thickness gradually decreases as getting away from the end of the magnetoresistive sensor 112, and in its vicinity, the thinned area of the substantially same thickness is formed. Furthermore, on the outer side thereof, a slope section where the film thickness is gradually increases is formed, and then a thickened area with substantially the same film thickness is formed in a predetermined width (horizontal direction dimension in the drawing). The thickness of the outer thick part can be twice as the film thickness of the flat part in the vicinity of the magnetoresistive sensor 112, for example.

Thinning the hard bias film 115 in the vicinity of the magnetoresistive sensor 112 enables to control the bias field to the free layer 215 more effectively. Conforming the level position of the thinned hard bias film 115 to the one of the free layer 215 results in localizing and optimizing the bias field to be applied to the free layer 215. Besides, a thickened film part is formed on the far side from the magnetoresistive sensor 112 outside the thinned film part so that magnetic instability of the hard bias film 115 due to thinning the vicinity of the magnetoresistive sensor 112 can be eliminated. Namely, thickening the free layer 215 can improve magnetic stability and the magnetic field from the part can improve the magnetic stability of the thinned hard bias film 115 in the vicinity of the magnetoresistive sensor 112.

The top surface position of the hard bias film 115 in the vicinity of the magnetoresistive sensor 112 may substantially coincide with the top surface position of the free layer 215: otherwise it is lower than the position of 5 nm above the top surface position of the free layer 215 (refer to Fsh in FIG. 2). This reduces the bias field which leaks from the hard bias film 115 to the upper shield 113 due to the hard bias film 115 getting closer to the upper shield 113 in the vicinity of the magnetoresistive sensor 112. Consequently, the reduction of the bias field applied to the free layer 215 can be suppressed.

Figure 17A:
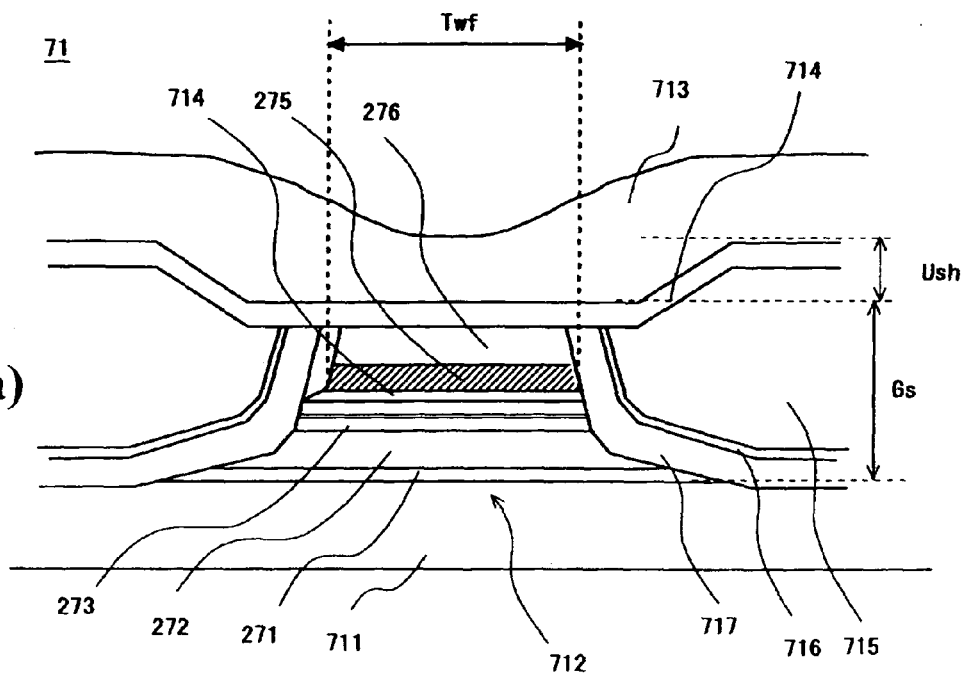
FIGS. 17(a) and 17(b) are cross-sectional views schematically showing the configuration of the CPP reproducing head and the etching damage in the manufacturing steps of the CPP reproducing head according to the conventional technique.
Figure 17B:
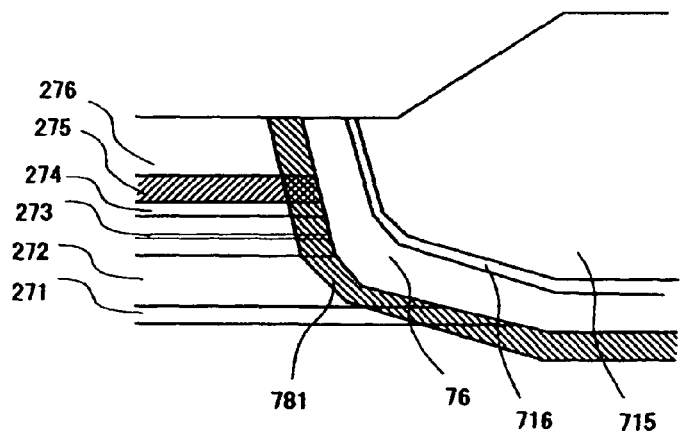

Thinning the junction insulating film 16 and the hard bias film 115 in the vicinity of the magnetoresistive sensor 112 contributes to flattening of the upper shield 113. Especially, in the case of narrowing the shield space Gs for increasing the recording frequency of the magnetic disk, the above structure is advantageous for the flattening of the upper shield 113. At the upper side of the magnetoresistive sensor 112, if the upper shield 113 is depressed shaped (refer to the conventional technique of FIG. 17(a)), the effect of the upper shield 113 is decreased at the side end part of the magnetoresistive sensor 112 so that a spread width in reading increases. Accordingly, the upper shield 113 is preferably to be flattened across the track width Twf of the free layer. In the reproducing head 11 of FIG. 2, the upper shield 113 is substantially flat.

In the reproducing head 11 of FIG. 2, the junction insulating film 16 and the hard bias film 115 are thinned above the antiferromagnetic layer 212. As a result, the top surface of the thinned hard bias film 115 in the vicinity of the magnetoresistive sensor 112 is located lower than the top surface of the sensor cap film 216. The upper shield 113 is flattened corresponding to the thinned and flattened regions, and as a result, the upper shield 113 has a flattened width Usw. The upper shield flattened width Usw has a larger than the track width of the free layer Twf and sufficient size. It may be formed so as to have substantially the same size as the track width of the free layer Twf+2 Gs. As a result, the spread in reading can be reduced at the end of the free layer 215 and the output characteristic can be maximized.

In order to flatten the top surface of the upper shield 113 in the region overlapping the free layer 215, it is important that the film thickness of the thickened part of the hard bias film 115 is not too large. In the structure of FIG. 2, the level position of the top surface of the outer thickened part of the hard bias film 115 is lower than the level position of the under surface of the part of the upper shied 113 overlapping the free layer 215. This structure can make the level difference Ush of the upper shield 113 small and improve the flattening the shape of the upper shield 13 above the free layer 215. The dimension of the level difference Ush is preferably not more than 20 nm, and more preferably not more than 10 nm.

Figure 3:
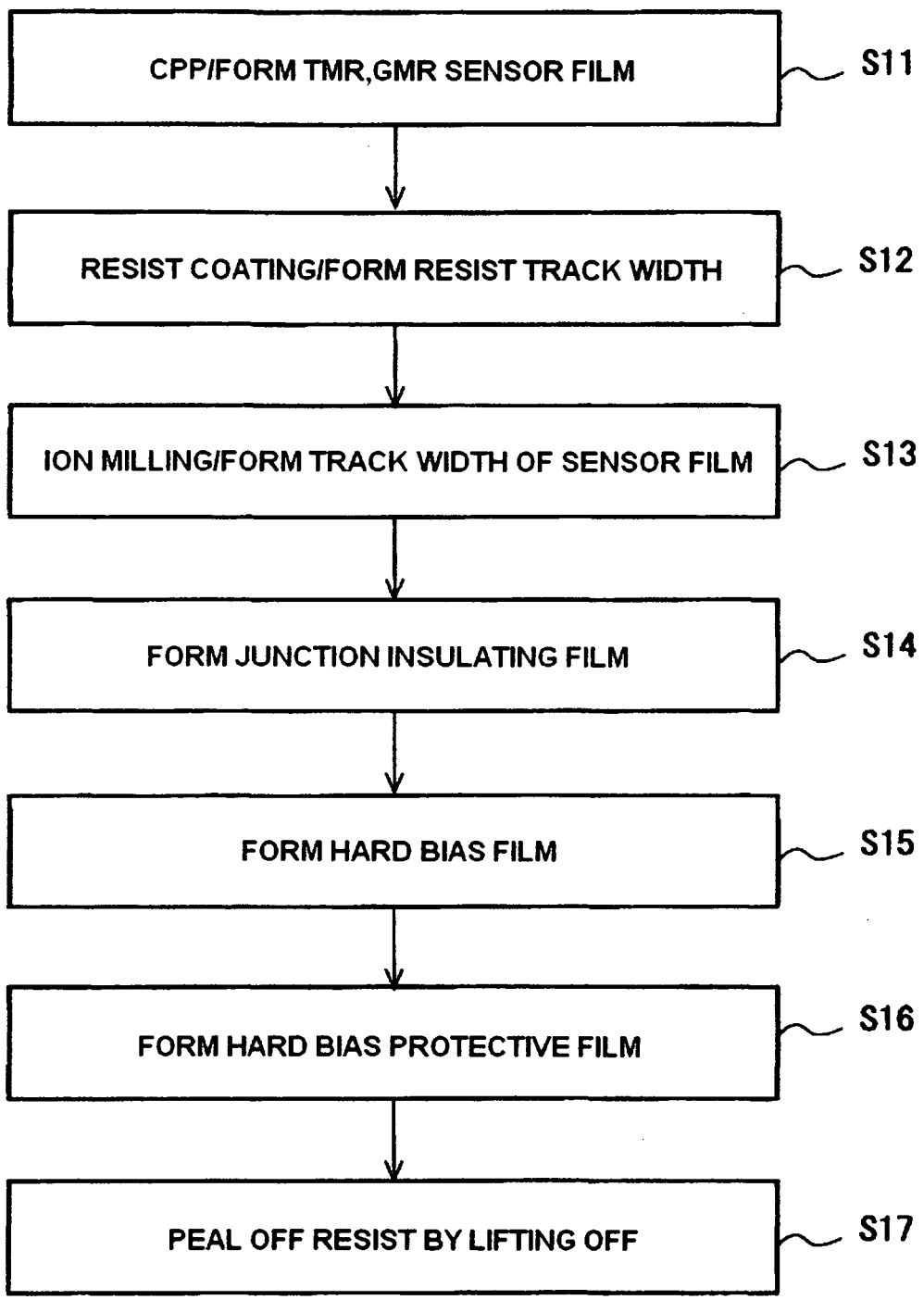
FIG. 3 is a flowchart showing the manufacturing steps of the reproducing head according to one embodiment.

Next, manufacturing steps of the reproducing head structure shown in FIG. 2 will be described referring to a flowchart of FIG. 3. First, a multilayer film constituting the magnetoresistive sensor 112 is formed by sputtering deposition (S11). Then, a resist layer is formed by resist coating and patterning (S12). A track width of the magnetoresistive sensor 112 is formed by using ion beam etching (ion milling). The present embodiment has a feature in this etching step, which will be described later. This etching etches from the sensor cap film 216 to the sensor underlayer 211.

Then, the junction insulating film 16 is deposited (S14). Further, the hard bias film 115 is deposited (S15). In the present embodiment, the junction insulating film 16 and the hard bias film 115 are formed by means of ion beam deposition (IBD). The present embodiment has a feature in the method for depositing these layers, which will be described later. Then, after the hard bias film protective film 117 has been formed (S16), the resist is peeled off by lifting off (S17).

Hereinbelow, the track width forming step (S13) of the magnetoresistive sensor 112 according to an embodiment of the present embodiment will be described in detail. FIG. 4 is an overview of ion beam etching (IBE) used in the track width forming step (S13) of the magnetoresistive sensor 112 according to the present embodiment. The rectangles on the substrate 51 represent resists 52 patterned corresponding to the respective reproducing head elements. This IBE irradiates an Ar ion beam onto a substrate in its inclined state and rotates the substrate 51 about its normal as a rotational axis. A conventional track width forming step irradiates an Ar ion beam onto the substrate 51 all the time while the IBE is rotating the substrate 51. The IBE according to the present scheme, however, irradiates the Ar ion beam onto the substrate 51 only in a predetermined specific substrate rotational angle range.

Figure 4A:
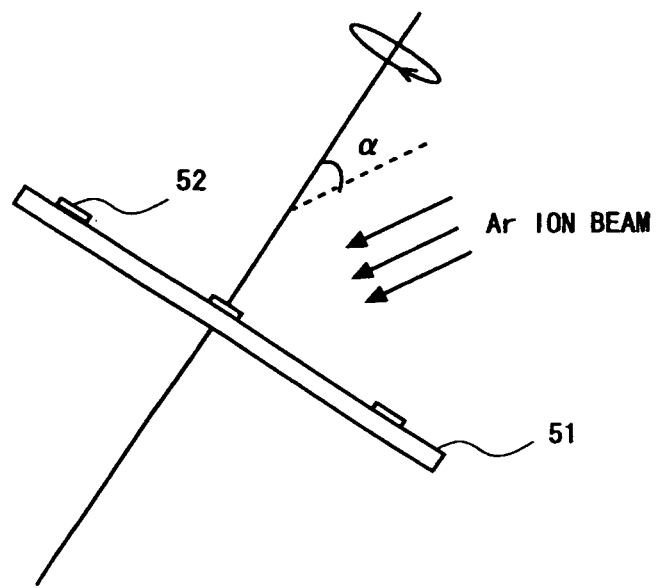
FIGS. 4(a) and 4(b) are views schematically showing the etching method in the manufacturing steps of the reproducing head according to one embodiment.
Figure 4B:
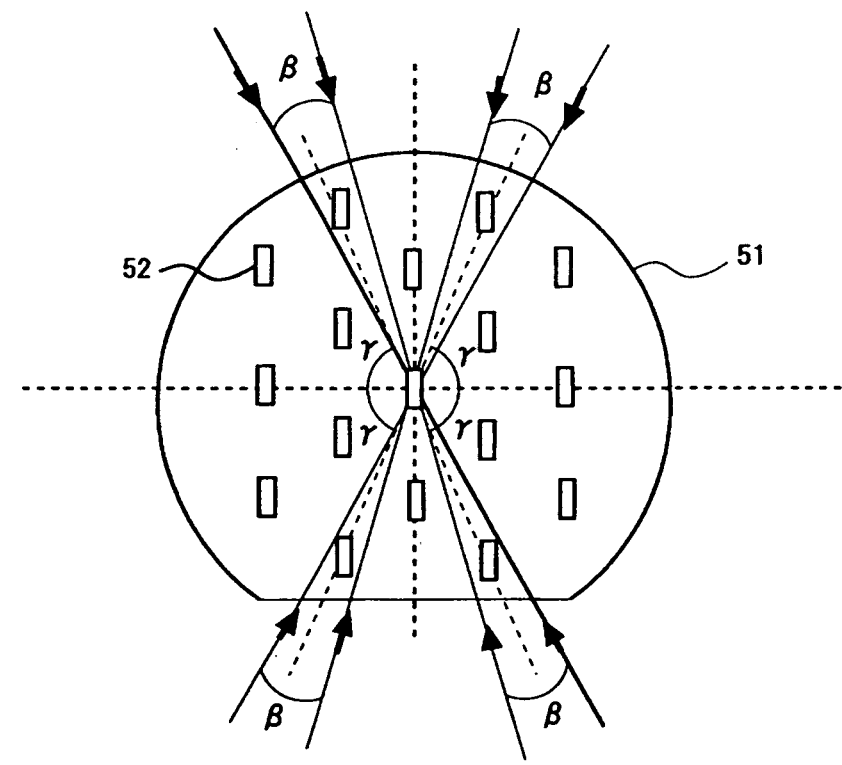

In the example of FIG. 4(a), the incident angle of the Ar ion beam is inclined with respect to the normal of the substrate 51 and the inclined angle is represented by α. The substrate 51 is rotating uniformly at an almost constant angular rate. As a feature of this IBE, the Ar ion beam is irradiated onto the substrate not all the time while the substrate 51 is rotating but intermittently. FIG. 4(b) schematically shows this situation. Specifically, the substrate is rotating at the inclined angle α. The resists are formed symmetrically in the top-bottom direction. The Ar ion beam is generated and irradiated onto the substrate only when the angles in the substrate rotational direction are within the rotational angles of β about γ.

The incident angle of the Ar ion beam is constant to the normal of the substrate. However, the incident direction of the Ar ion beam projected onto the rotational direction of the substrate plane is limited to selected angular ranges to the resist 52 (magnetoresistive sensor 121). Therefore, controlling the incident angle of the Ar ion beam to the inclined surface on the side end of the magnetoresistive sensor 112 is achieved so that the etched shape of the inclined surface on the side end of the magnetoresistive sensor 112 can be controlled with high accuracy. Or, properly selecting a part of the incident angle of the Ar ion beam enables to minimize re-deposition to the inclined surface on the side end of the magnetoresistive sensor 112 and to reduce etching damage.

Figure 5A:
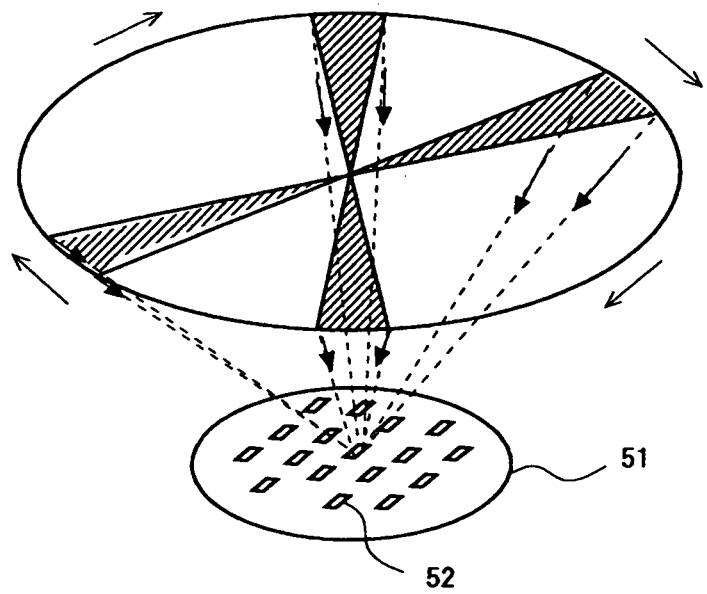
FIGS. 5(a) and 5(b) are views schematically showing the incident direction of the Ar ion beam and the etching situation in the etching step according to one embodiment.
Figure 5B:
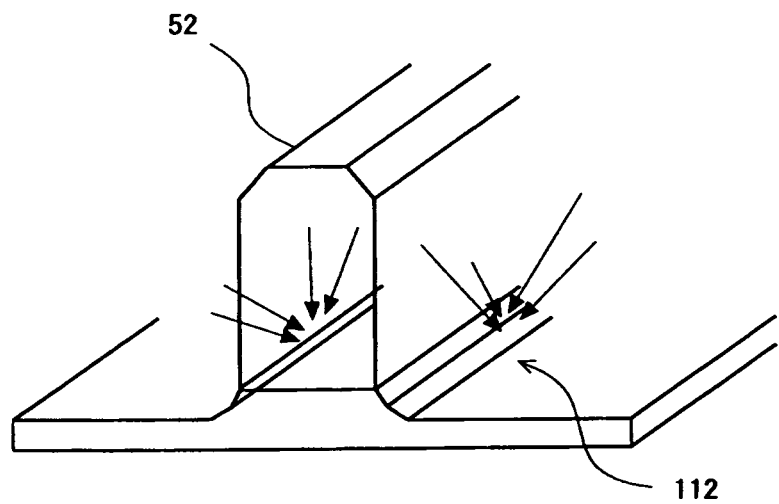

FIG. 5(a) schematically shows relative change in incident direction of the Ar ion beam to the substrate 51. FIG. 5(b) schematically shows the incident direction of the Ar ion beam to the side end surface of the magnetoresistive sensor 112. While the substrate 51 is rotating, the incident angle α of the Ar ion beam to the normal of the substrate 51 is constant. Therefore, as shown in FIG. 5(a), the incident direction of the Ar ion beam including the directions where the ion beam is not actually irradiated performs a precession movement with respect to the normal of the substrate 51, as relatively viewed from the substrate 51. If the incident direction is projected onto the substrate surface, the incident angular range in an in-plane direction is limited to a specific range.

In this IBE, as shown in FIG. 5(a), Ar ion particles, which are etching particles, are irradiated at a selected angular range of the incident direction projected on and rotating in the substrate plane. It may important to select a symmetric angular range with respect to the top-bottom and left-right directions in FIG. 4(b) and perform the etching symmetrically in the vicinity of a photoresist 52.

FIGS. 4(b) and 5(a) are examples of two-fold symmetry. The respective incident angular ranges are symmetric in the top-bottom direction and the left-right direction. Namely, intermittent four times of irradiation of Ar ion beam are made to the periphery of the photoresist 52 (magnetoresistive sensor 112). The sweep angles (incident angular ranges irradiated continuously) β at the respective irradiations are the same and the angles γ between the respective incident central angles (incident directions to the center during sweeps) and the track width directions are the same. That is, in a specific angular range centered on the track width direction and a specific angular range centered on the vertical direction to the track width direction, the Ar ion beam irradiations are skipped.

Some approaches can be proposed to limit the incident angular range of the Ar ion beam. The incident timing of the Ar ion beam can be controlled by, for example, 1) performing an etching as controlling the substrate rotational direction to oscillate and rotate to-and-fro, 2) opening and closing a shutter when the substrate rotational angle comes to a required incident angle, or 3) delaying the rotational speed when the substrate rotational angle comes to a required incident angle so as to perform the etching only at the effective incident angle.

However, it may be preferable, as described above, to control the incident angle of the Ar ion beam in the substrate rotational direction electrically than mechanically. An attempt to control mechanically may leave the problem of re-deposition. Therefore, an approach may generate an ion beam by means of an ion gun only when the substrate comes into the angular range of the required particle incident direction with the substrate inclined and being rotated, and performs the etching by a pulsed ion beam synchronized with the rotation of the substrate. The incident timing of the ion beam can be easily controlled by controlling acceleration voltage to the ion gun electrically.

Figure 6A:
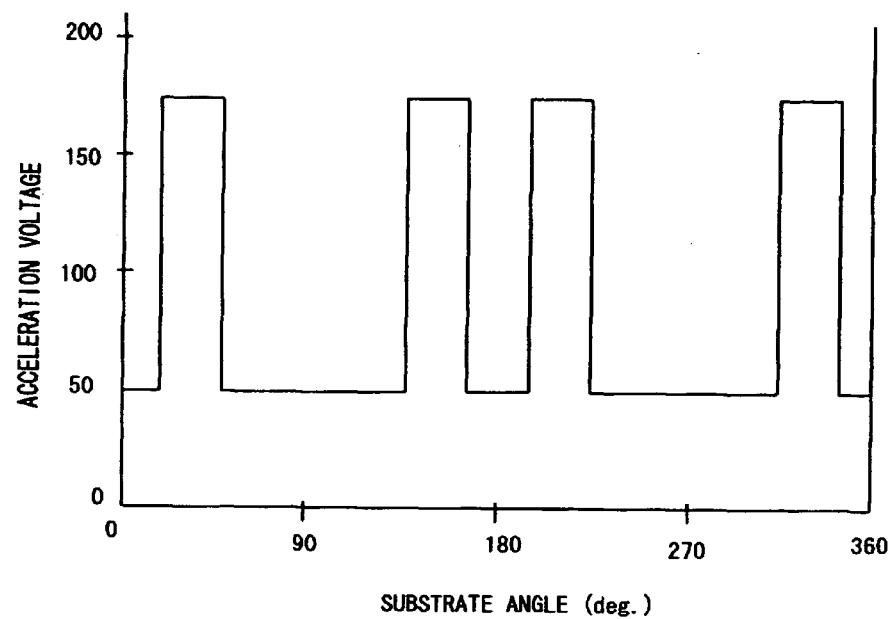
FIGS. 6(a) and 6(b) are views showing an example of the waveform of the acceleration voltage of the Ar ion beam in the etching step according to one embodiment.

FIG. 6(a) illustrates changes in acceleration voltage corresponding to the examples of FIGS. 4(b) and 5(a). Since four times of intermittent Ar ion beam irradiation are made in this example, the acceleration voltage shows four pulses with respect to the angle in the horizontal axis. The angle represents the angle of the substrate 51, or the angle of the incident direction of the Ar ion beam projected on the substrate 51; and 0° represents the direction along the side end surface of the magnetoresistive sensor 112, or the top-bottom direction in FIG. 4(b) and the direction perpendicular to the ABS.

Figure 6B:
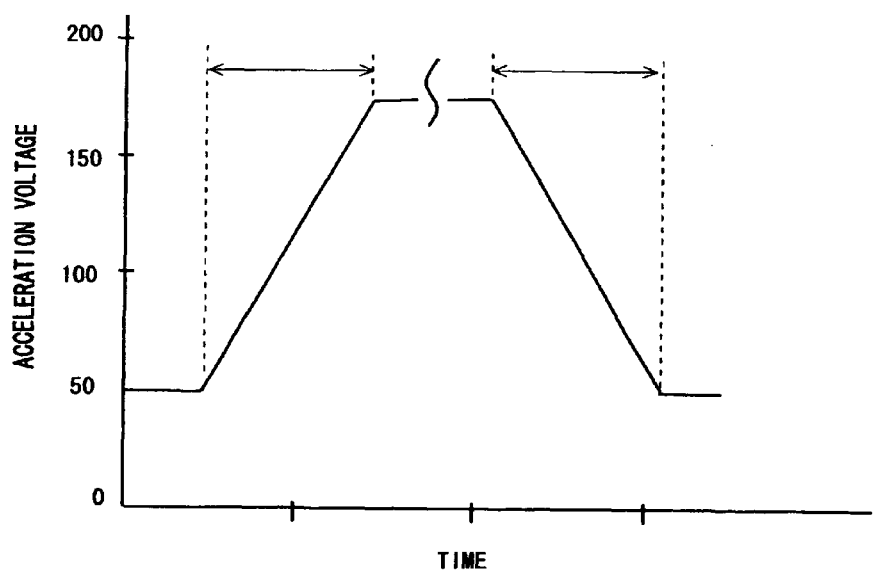

The respective pulsed waveforms are symmetric with respect to 180°. The two pulsed waveforms between 0° to 180° are symmetric with respect to 90° and the two pulsed waveforms between 180° to 360° (0°) are symmetric with respect to 270°. 90° and 270° correspond to the track width direction in the case that the incident direction of the Ar ion beam is projected on the substrate 51. FIG. 6(b) shows an example of an acceleration voltage waveform corresponding to one time of the Ar ion beam irradiation and a rising and a falling inclinations are set to the optimum according to the design within a condition range where the Ar ion beam can be generated stably.

Figure 7A:
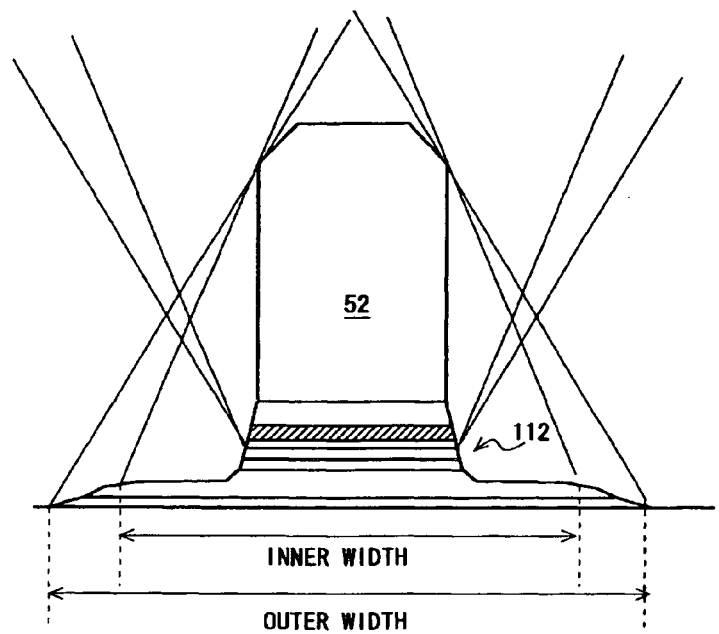
FIGS. 7(a) and 7(b) are views schematically showing the incident direction of the Ar ion beam and the etching situation in the etching step according to one embodiment.

FIG. 7(a) shows a situation of the etching (S12) of the magnetoresistive sensor 112 covered by a photoresist 52 and shows a status after the track width forming step by etching (S12), as viewed from the ABS. The magnetoresistive sensor 112 is covered by the patterned photoresist 52 and the region exposed from the photoresist 52 is etched by the Ar ion beam. FIG. 7(a) illustrates a range of changing incident direction of the Ar ion beam.

Figure 7B:
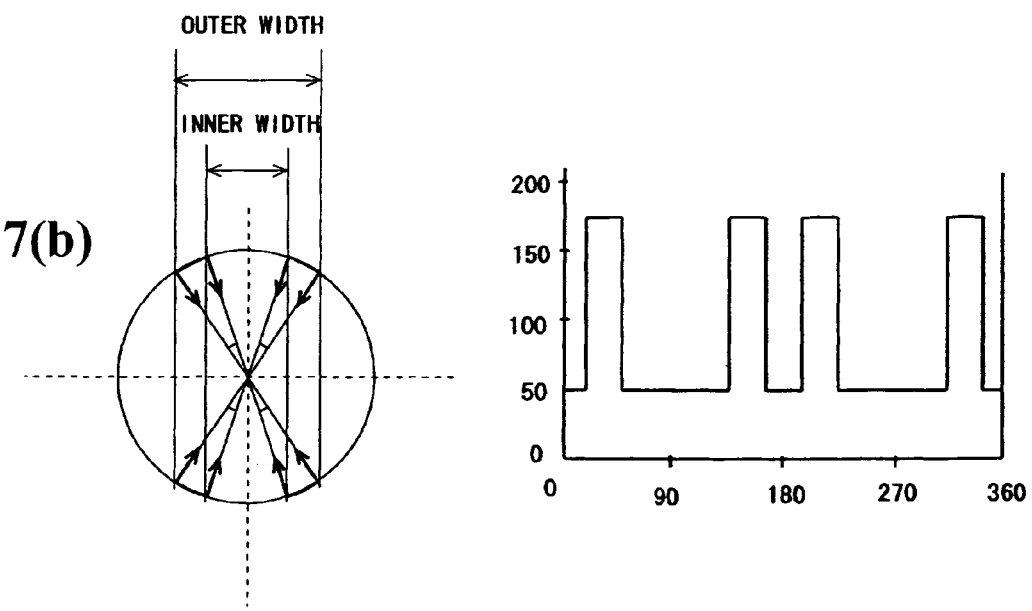

As described above, the Ar ion beam is irradiated top-bottom and left-right symmetrically to the substrate plane. FIG. 7(b) shows change in incident direction of the Ar ion beam and its corresponding acceleration voltage as seen from the top of the substrate. Specifically, FIG. 7(b) shows the above-described two-fold symmetric incident directions of the Ar ion beams and an acceleration voltage waveform corresponding to the incident direction.

In FIG. 7(b), the twelve o'clock direction of the circle indicating the incident direction corresponds to 0° in the waveform graph. The incident direction changes clockwise, for example, and the angle of the waveform corresponding to each direction increases accordingly. In the two-fold symmetry, on the respective sides of the left and right of the track width direction of the magnetoresistive sensor 112, two times of the Ar ion beam irradiation are performed.

As shown in FIG. 7(a), when the Ar ion beam is irradiated from the right of the magnetoresistive sensor 112, the whole area of the right side of the magnetoresistive sensor 112 is exposed to the Ar ion beam, but a part of the opposite left side gets behind the photoresist 52 and the Ar ion beam does not reach there. Similarly, when the Ar ion beam is irradiated from the left of the magnetoresistive sensor 112, the whole area of the left side of the magnetoresistive sensor 112 is exposed to the Ar ion beam, but a part of the right side gets behind the photoresist 52 and the Ar ion beam does not reach there. Since the incident direction of the Ar ion beam is left-right symmetric, the regions which the Ar ion beam etches are left-right symmetric, too.

The closer the incident direction of the Ar ion beam gets to the top-bottom direction of FIG. 7(b) or 0° and 180°, the smaller the blocked region behind photoresist 52 becomes. Within the incident angular range where the Ar ion beam is actually irradiated, at the angular positions where its incident direction is the nearest to the track width direction (90° and 270°), the outer width (OUTER WIDTH) of the lower layers of the magnetoresistive sensor 112 is determined.

At the angular position where the Ar ion beam incident direction is the farthermost from the track width direction (nearest to 0° and 180°), the inner width (INNER WIDTH) of the lower layers of the magnetoresistive sensor 112 is determined. Between the position defining the inner width of the lower layers of the magnetoresistive sensor 112 and the position defining the outer width thereof, the film thicknesses of the antiferromagnetic layer 212 and the sensor underlayer 211 gradually changes. Thus, limiting the incident direction of the Ar ion beam results in forming level differences of the antiferromagnetic layer 212 and the sensor underlayer 211.

Figure 8A:
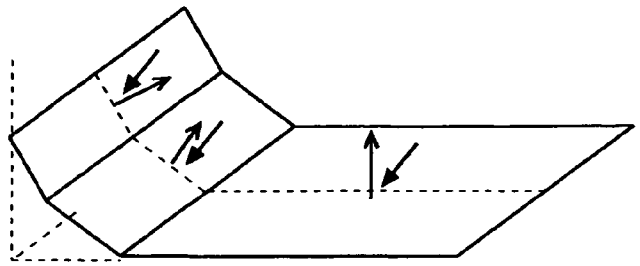
FIGS. 8(a)-8(c) are views showing the changes in etching state according to the incident angle of the Ar ion beam in the etching step according to one embodiment.

Next, changes in etching conditions corresponding to changes in the incident direction of the Ar ion beam caused by the rotation of the substrate 51 will be described. FIG. 8(a) schematically shows the incident angles of the Ar ion beam at one of the side ends of the magnetoresistive sensor 112. The Ar ion beam is irradiated obliquely to the normals of the respective surfaces. If the incident direction of the Ar ion beam to the substrate 51 changes, the incident angle to the surface of the side end of the magnetoresistive sensor 112 changes. Etching damage to each layer differs in accordance with the incident angle of the Ar ion beam.

Figure 8B:
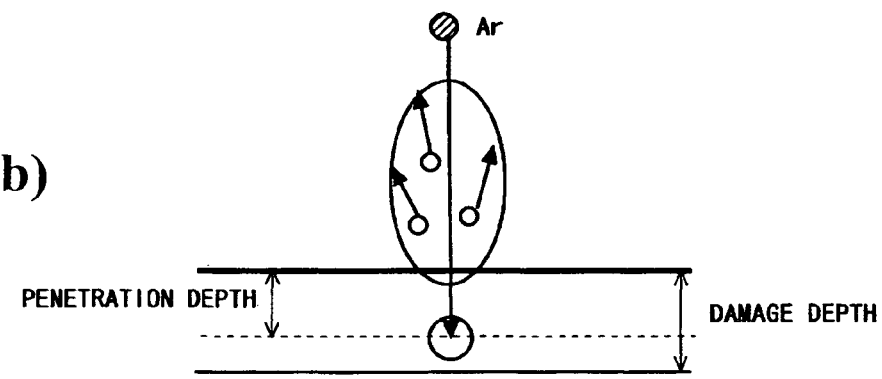
Figure 8C:
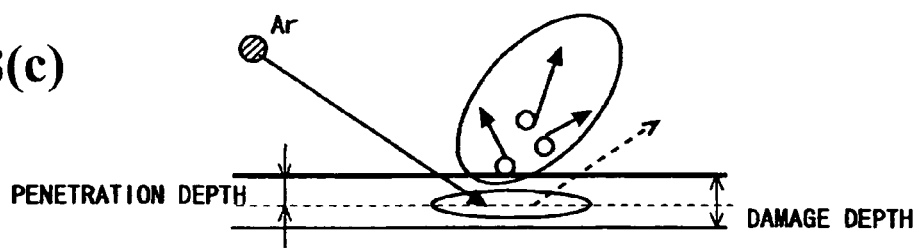

Comparing to the Ar ion beam irradiated vertically to the layer surface (incident angle 0°) as shown in FIG. 8(b), the Ar ion beam irradiated obliquely to the layer surface (corresponding to increase of the incident angle) can reduce the depth of the etching damage. In the etching step of the magnetoresistive sensor 112, it is important to reduce the etching damage of the side end. This is because if the etching damaged layer is deep, shunt current flows in the part and the magnetoresistive sensor 112 does not function properly. Therefore, it may be important to reduce the etching damage particularly on the side end of the non-magnetic intermediate layer 214.

In the above IBE, the incident angle of the Ar ion beam to the side ends of the magnetoresistive sensor 112 is inclined to the track width direction in forming the shapes of the end parts of the magnetoresistive sensor 112. Specifically, the incident directions of the Ar ion beam are limited to the incident angles within the angular range $\beta$ centered on the inclination angles $\gamma$ to the track width direction. The incident angle of the track width direction has the smallest incident angle to the normal of the side end surface and the incident angle gets larger as departing from the direction. With regard to the etching damage, it may be preferable to increase the incident angle, that is, to increase the above $\gamma$ and to decrease the $\beta$.

Figure 9:
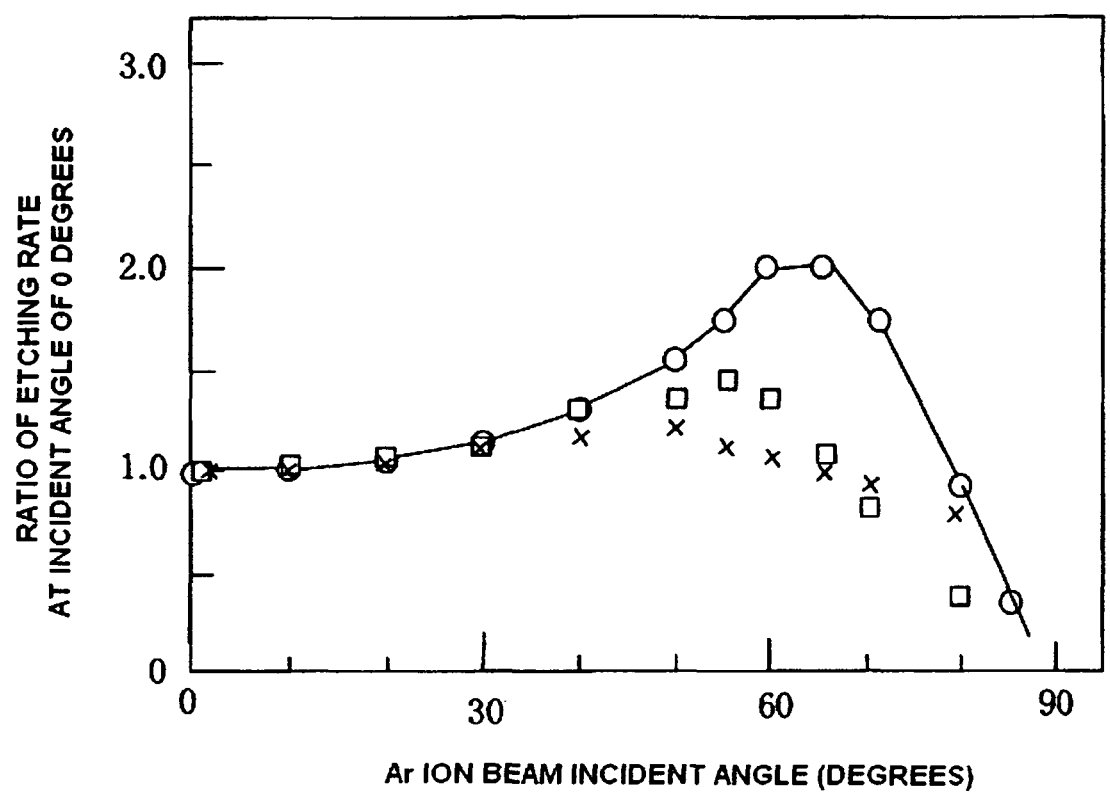
FIG. 9 is a graph showing an example of the relationship between the etching rate and the incident angle of the Ar ion beam in the etching step according to one embodiment.

However, if the incident angle is too large, the etching rate significantly decreases so that the angle of the side end becomes small, that is, the inclination of the side end becomes smaller. FIG. 9 is a graph showing an example of the relationship between the incident angle of the Ar ion beam and the etching rate and is a standardized graph by the etching rate at the incident angle of 0° while energy levels are represented by o, □, and x in order from highest. It shows that the etching rate decreases if the etching energy is low and the etching rate differs according to the incident angle.

Therefore, selecting an optimum etching angle and conditions for the inclination angle of the side end of the magnetoresistive sensor 112 enables to select the ratio between the etching rate for the inclination angle of the side end and the etching rate in the normal direction to the substrate plane. As a result, the inclination angle of the side end can be elevated while reducing the etching damage.

Therefore, from the point of view of the characteristics of the magnetoresistive sensor 112, the inclination of the side ends of the magnetoresistive sensor 112 may preferably be large. Specifically, the inclination angle (refer to ψ in FIG. 2) of the side ends of the fixed layer 213, the non-magnetic intermediate layer 214, and the free layer 215 is may preferably be not less than 45°. Here, the inclination angle corresponds to the angle to the track width direction in the film plane of the magnetoresistive sensor 112. From the foregoing, in the actual manufacturing step, the side ends of the magnetoresistive sensor 112 are formed steep, and the angular range of the incident direction of the etching energy and the ion beam is determined so as to make the etching damage small.

Figure 10:
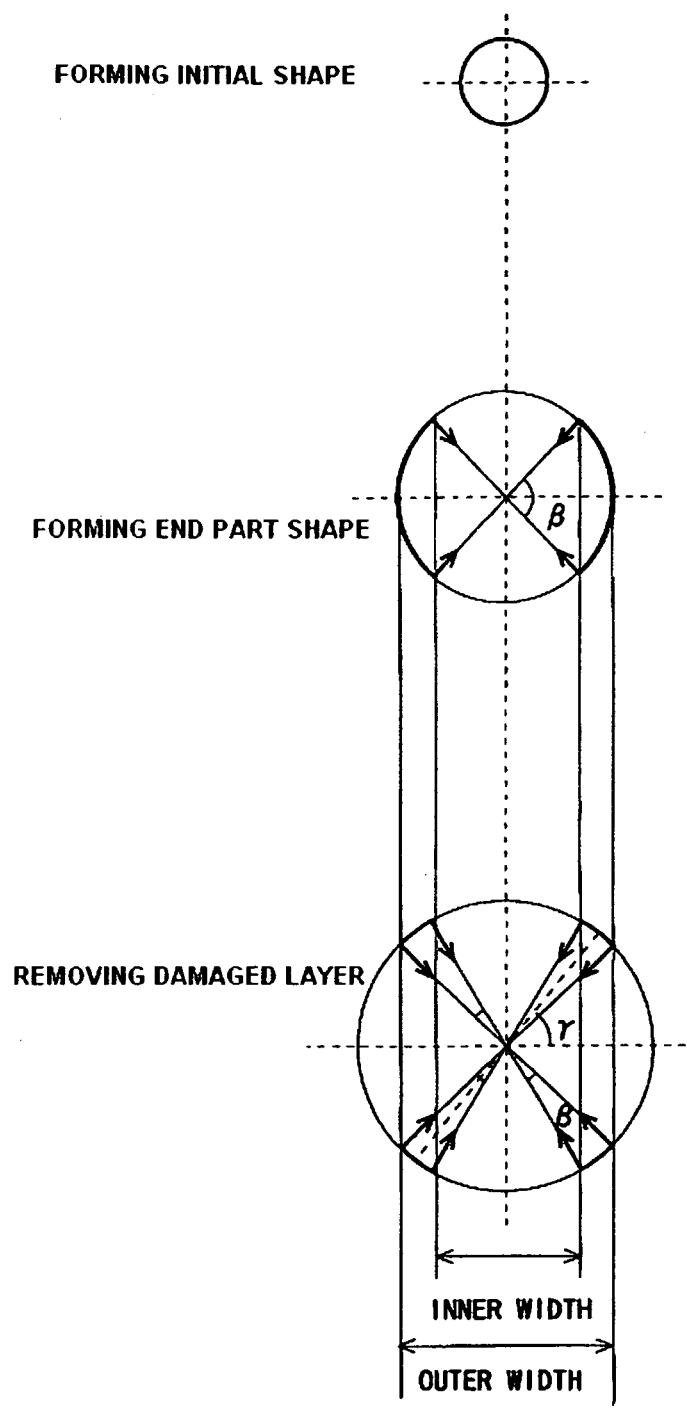
FIG. 10 is a drawing schematically showing changes of the Ar ion beam incident direction in the etching step according to one embodiment.

If the IBE in the magnetoresistive sensor 112 etching step (S13) is performed by the above-described method only, the process time may be long and the throughput may decrease. Therefore, during the etching process of the end parts of the magnetoresistive sensor 112, the incident angular range of the Ar ion beam is preferably changed. This makes the final etching damage small and increases the throughput. FIG. 10 shows an example of a technique to control the incident angular range of the Ar ion beam. In FIG. 10, the magnetoresistive sensor 112 etching step (S13) is consisted of three steps: an initial shape forming step, an end part shape forming step, and a damaged layer removing step.

The circles in the respective steps show rotation of the incident direction to the substrate plane and their radii become larger as the inclination angle $\alpha$ to the substrate normal becomes larger. At the initial shape forming step, the Ar ion beam is irradiated from all directions according to the substrate rotation. The inclination angle $\alpha$ to the substrate normal is set smaller than the ones at the later steps.

Then, the end part shape forming step is processed with the inclination angle $\alpha$ to the substrate normal set larger. In this step, the Ar ion beam is irradiated only at a specific angular range among the rotational direction to the substrate plane. The irradiation of the Ar ion beam in this step is one-fold symmetric, compared to the two-fold symmetric Ar ion beam irradiation in the following damaged layer removing step.

Namely, the Ar ion beam is irradiated from the left and right of the track width direction (the left-right direction in FIG. 10, and 90° and 270° in FIG. 7(b)) respectively and within the specific angular ranges which are symmetric with respect to the track width direction. The Ar ion beam irradiation is skipped within predetermined angular ranges centered on the vertical direction to the track width direction in the substrate plane (the top-bottom direction in FIG. 10, and 0° and 180° in FIG. 7(b)).

In this step, the end part shape of the magnetoresistive sensor 112 is determined. As similar to the description referring to FIGS. 7(a) and 7(b), the outer width (OUTER WIDTH) of the lower layers of the magnetoresistive sensor 112 is defined by the irradiation in the track width direction and the inner width (INNER WIDTH) thereof is defined by the irradiation at the angle farthest from the track width direction. In this step, the Ar ion beam is irradiated within the angular range centered on the track width direction so that the Ar ion beam incident angle to the end part of the magnetoresistive sensor 112 is small and the depth of the etching damage is large. However, as the etching time per one rotation of the substrate is long and the specific incident angles are included, the etching rate increases. Therefore, the process time can be shortened. In this step, a re-deposited film by etching is removed together.

Next, the damaged layer removing step is carried out with the more increased inclination angle $\alpha$ to the substrate normal. This step is a two-fold symmetric Ar ion beam irradiation similar to the description referring to FIGS. 7(a) and 7(b). Generally the damaged layers in the end part shape forming step is approximately 2 nm. Therefore, etching this damaged layer by the Ar ion beam with the larger incident angle to cause a little etching damage can reduce the final etching damage at the end part of the magnetoresistive sensor 112. The inclination angle $\alpha$ to the substrate normal and the incident angles ($\beta$ and $\gamma$) to the substrate plane are set so that the outer width (INCIDENT OUTER WIDTH) and the inner width (INCIDENT INNER WIDTH) of the lower layers of the magnetoresistive sensor 112 are the same as the ones in the end shape forming step. Thereby, the etching damage layer on the end part of the magnetoresistive sensor 112 is removed and deformation of the level difference of the sensor underlayer 211 and the antiferromagnetic layer 212 is suppressed.

Figure 11A:
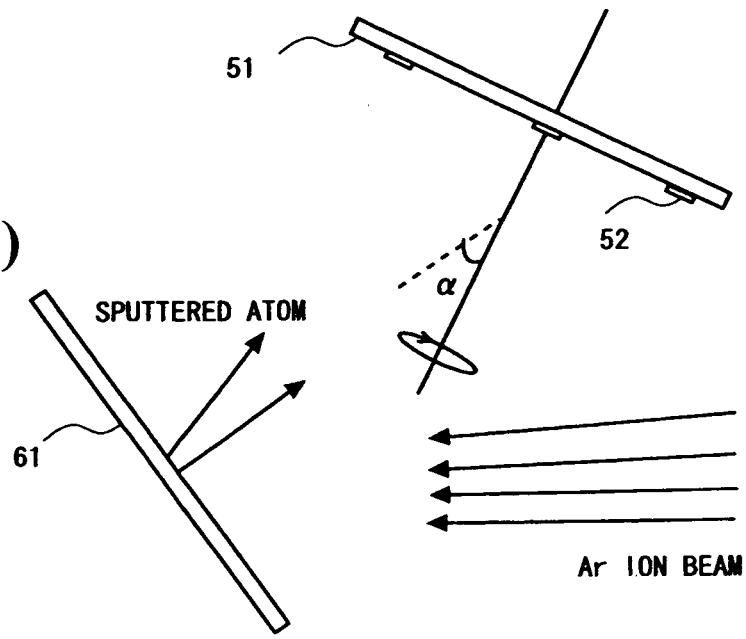
FIGS. 11(a) and 11(b) are drawings schematically showing the sputtering deposition method in the reproducing head manufacturing step according to one embodiment.
Figure 11B:
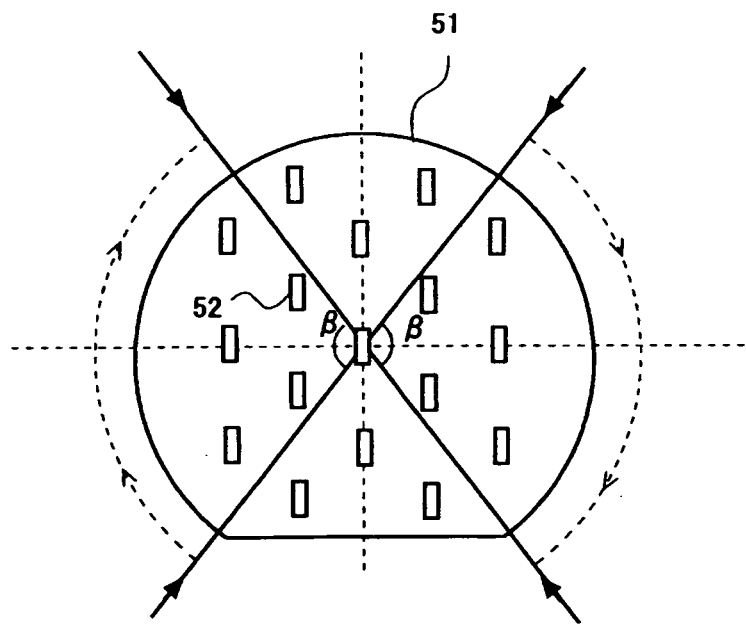

Hereinbelow, the junction insulating film 16 deposition step (S14) and the hard bias film 115 deposition step (S15) according to the present embodiment will be described in detail. FIG. 11(*a*) schematically shows an ion beam sputtering method used in these steps. The ion beam sputtering method controls deposition property of a deposited film and photoresist end part shape by controlling the incident direction of the ion beam to a target 61 (angle between the target normal and the incident direction) and incident direction α of sputtered particles from the target 61 to the substrate. The substrate rotates uniformly during growth of the film.

As a method for growing a film, similarly to etching, sputtered particles are made to be irradiated at predetermined angles in the rotational direction angle in the plane of the substrate. Also, selecting left-right and top-bottom symmetrical angles with respect to the photoresist direction are selected so that the deposition property of the film in the vicinity of the photoresist becomes symmetric. It is similar to the etching that some approaches for growing films can be proposed in which the particle incident direction in the substrate rotational direction is defined like this. It may be preferable that the film deposition step adopts a similar scheme to the etching. That is, the ion gun generates ion beams only when the substrate has got in the required angular range for the particle incident direction and the film is grown by the pulse ion beam synchronized with the rotation of the substrate.

FIG. 11(*b*) shows an incident direction of sputtered particles as seen from the substrate 51. Controlling the particle angle α irradiated from the target to the substrate and the angle β in the rotating substrate plane enables to control grown film shape in the vicinity of the photoresist as well as the particle incident position. FIG. 11(*b*) shows an example of one-fold sputtered particle irradiation.

Figure 12A:
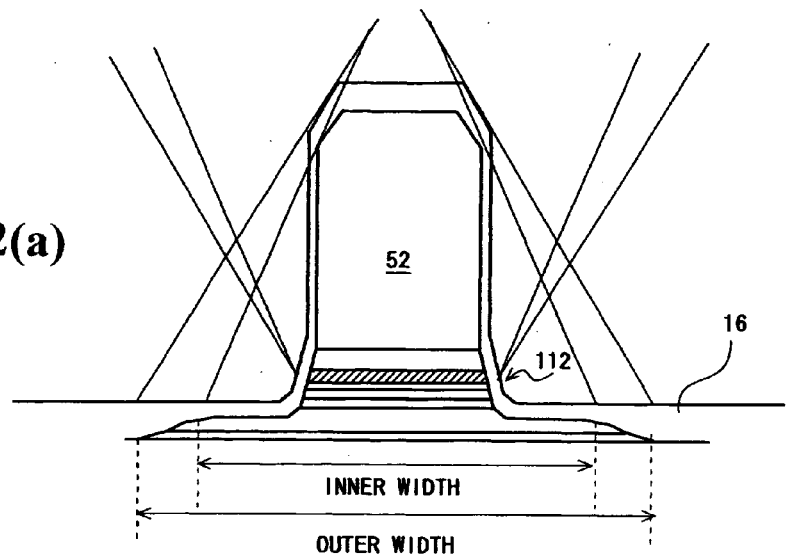
FIGS. 12(a)-12(c) are drawings schematically showing the incident direction of the sputtered particles and the insulating film to be formed in the insulating film forming step according to one embodiment.
Figure 12B:
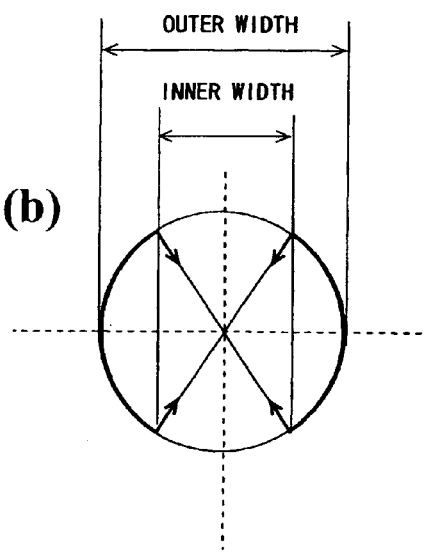
Figure 12C:
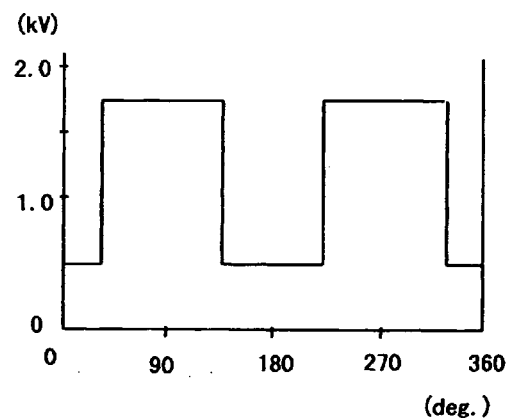

FIG. 12(*a*) schematically shows the deposition step of the junction insulating film 16. FIG. 12(*b*) shows incident directions of the sputtered particles in the substrate plane and FIG. 12(*c*) shows an accelerated voltage of the corresponding ion beam. Since the description about the irradiation of the etching particles referring to FIG. 7 is applicable to the irradiation of sputtered particles, detailed description will be omitted. The important matter on this occasion is to deposit the junction insulating film 16 to conform to the shape of the two level differences of the sensor underlayer 211 and the antiferromagnetic layer 212. This results in that the top surface of the junction insulating film 16 is flattened.

Specifically, the outer width (INCIDENT OUTER WIDTH) and the inner width (INCIDENT INNER WIDTH) shown in FIGS. 12(*a*) and 12(*b*) are made to coincide with their values in the etching step (S13). Thereby, the junction insulating film 16 with larger thickness in the outer side thereof can be deposited so as to compensate the level difference of the sensor underlayer 211 and the antiferromagnetic layer 212.

That is, the region with thin film thickness of the junction insulating film 16 can be limited to between the junction width and the inner width (INCIDENT INNER WIDTH), and the film thickness of the other region can be made twice as thick as the one of the insulating film in the vicinity of the junction. Since it is able to minimize the area of the region of the thinned insulating film in the vicinity of the junction, dielectric strength reliability is improved. This means that the film thickness of the insulating film in the vicinity of the junction can be more thinned.

Figure 13A:
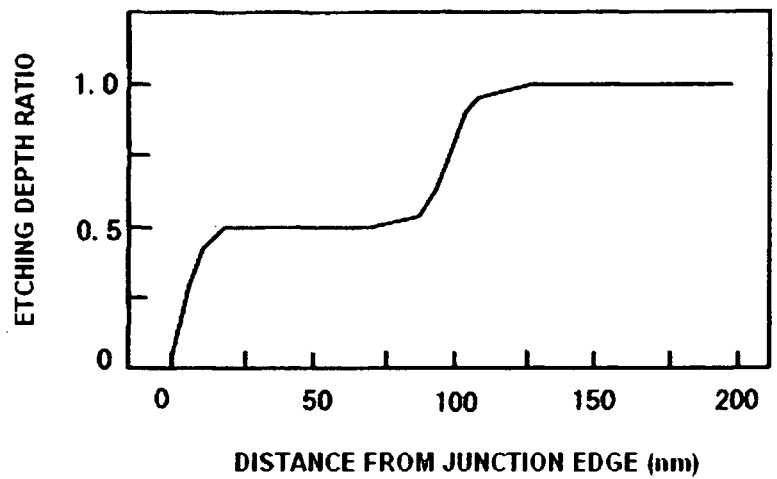
FIGS. 13(a) and 13(b) are graphs showing the relationship between the etching depth in etching of the magnetoresistive sensor and the film thickness forming the insulating layer in the reproducing head manufacturing steps according to one embodiment.
Figure 13B:
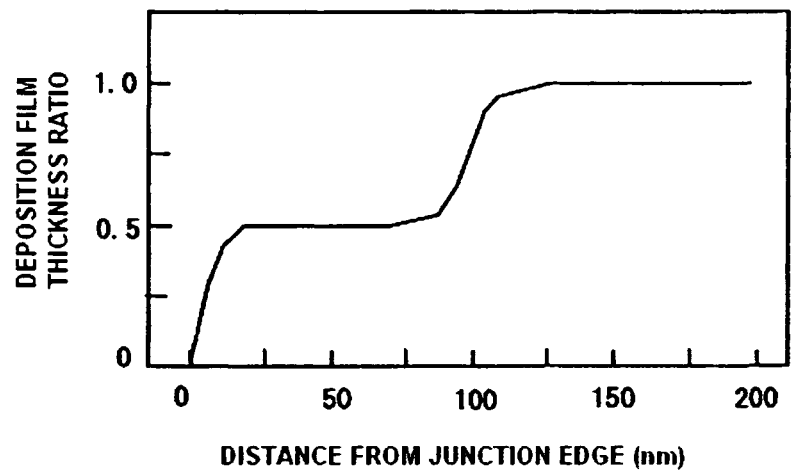

FIG. 13(*a*) shows an example of the relationship between the etching depth ratio of the sensor underlayer 211 and the antiferromagnetic layer 212 by the above-described etching and the distance from the side end of the magnetoresistive sensor 112. FIG. 13(*b*) shows an example of the relationship between the film thickness ratio of the junction insulating film 16 and the distance from the side end of the magnetoresistive sensor 112. As seen from FIGS. 13(*a*) and 13(*b*), the etching depth ratio and the film thickness ratio with respect to the distance from the side end of the magnetoresistive sensor 112 coincide. Thus, controlling the grown film thickness in accordance with the etched shape enables to flatten the top surface of the junction insulating film 16. Accordingly, the hard bias underlayer film and the hard bias film can be formed on the flattened insulating film with high precision in the next step.

Figure 14:
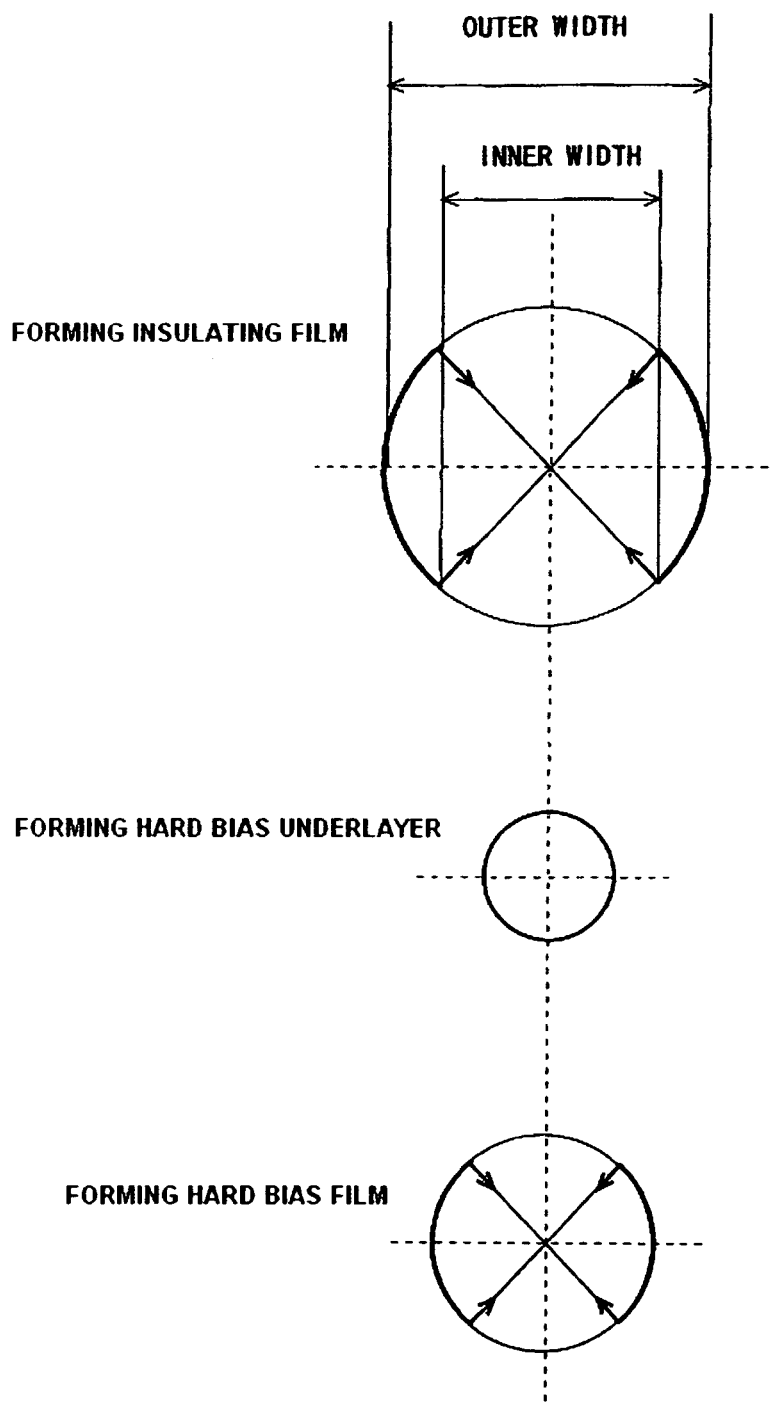
FIG. 14 is a drawing schematically showing changes in incident direction of the sputtered particles in the insulating film and hard bias film forming step according to one embodiment.

FIG. 14 shows a technique for controlling incident direction of sputtered particles in depositing the junction insulating film 16, the hard bias underlayer film 116, and the hard bias film 115. Each drawing denotes the same as in FIG. 10. The junction insulating film 16 is deposited by a one-fold symmetric irradiation of sputtered particles as described above.

In depositing hard bias underlayer film 116, the sputtered particles are irradiated from all directions with a smaller inclination angle α than the one in depositing the junction insulating film 16. The hard bias underlayer film control the crystallized state of the hard bias film and is made thin, whose film thickness is approximately 2.5 nm to 5 nm. On this occasion, the inclination angle α is selected to be small so that the underlayer film is not deposited onto the side walls as long as it can. The underlayer film deposited onto the side wall near the junction disrupts the crystallization property and impairs the magnetic characteristics at the end part of the hard bias film. As a result, the magnetic field applied from the hard bias film 115 to the free layer goes turbulent to reduce the reproducing sensor characteristics.

After forming the hard bias underlayer film 116, the hard bias film 115 is deposited by a one-fold symmetric irradiation of sputtered particles. In depositing the hard bias film 115, the sputtered particles incident angle α to the substrate normal and the angular range in the substrate plane are selected in accordance with the film shape. This deposition method provides the hard bias film 15 with magnetic anisotropy in the track width direction. That is, adding magnetic anisotropy in the track width direction improves magnetostatic characteristic in the track width direction so that characteristics of the hard bias film improve.

Selecting the step for depositing the hard bias film 115 by means of the one-fold symmetric irradiation of sputtered particles enables to form a hard bias film with a two-step film thickness structure and a flattened end shown in FIG. 13(*b*) as well as the junction insulating film 16. The hard bias film 115 and its underlayer film 116 are formed on the flattened junction insulating film 16, and selecting the incident angle α of the sputtered particles to the substrate normal and the optimum angular range in the substrate plane realizes the shape shown in FIG. 13(*b*). As a result, the top surface of the hard bias film in the vicinity of the junction can be formed at the same level as the top surface of the sensor cap film 216. Then, the under surface of the upper shield film 113 in the vicinity of the junction can be flattened in the length of Usw so that an error rate in reading adjacent data can be reduced in reproducing magnetic recording data.

Although the junction tip end of the hard bias film 115 is thinned by the one-fold symmetric irradiation of sputtered particles, it is formed thicker in the outside of the sputtered particles incident outer width (INCIDENT OUTER WIDTH) and its film thickness is twice as the one at the tip end of the junction. Therefore, magnetization at the tip end of the junction is assisted by magnetization of the outer thicker parts of the hard bias film and it will not be unstable. Accordingly, the film thickness at the tip end of the junction can be formed thinner compared to a conventional one so that a reproducing and reading head has a narrower Gs than a conventional one.

Two-fold symmetric irradiation of sputtered particles may be selected in depositing the sputtered particles depending on designs. As described above, in depositing the junction insulating film 16 and the hard bias film 115, selection of the incident direction of the sputtered particles can control their shapes in accordance with designs.

Figure 15A:
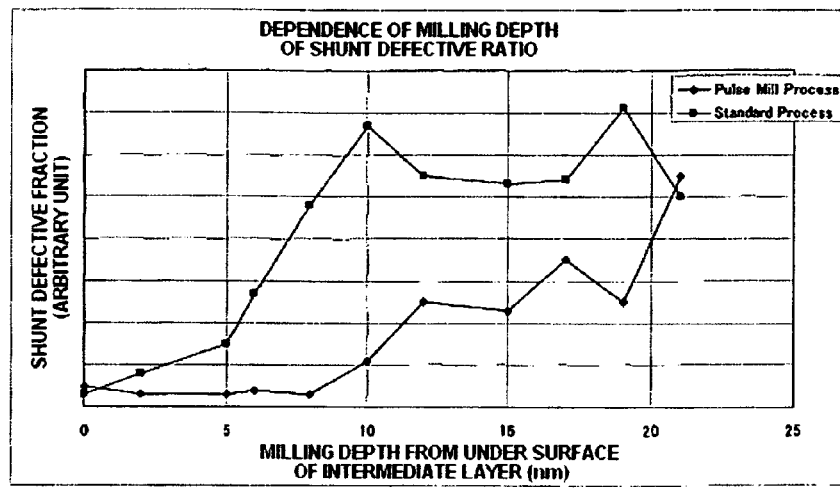
FIGS. 15(a) and 15(b) are graphs showing the relationship between the etching depth and the shunt defective fraction and a graph showing the relationship between the accelerate voltage of the Ar ion beam and the shunt defective fraction in the etching method according to embodiments of the present invention, and in the conventional etching method.

Hereinbelow, comparison results on the etching method and the deposition method according to embodiments of the present invention and the conventional method will be described referring to measured data. FIG. 15(a) shows the relationship between the etching depth and the shunt defective fraction in the etching methods of the present invention and the conventional technique. The etching depth is relative to the one in the non-magnetic intermediate layer 214. It has been apparent that, although the shunt defective fraction rises if the etching depth increases, the etching method according to embodiments of the present invention can keep the shunt defective fraction low even if the etching depth has been increased.

Figure 15B:
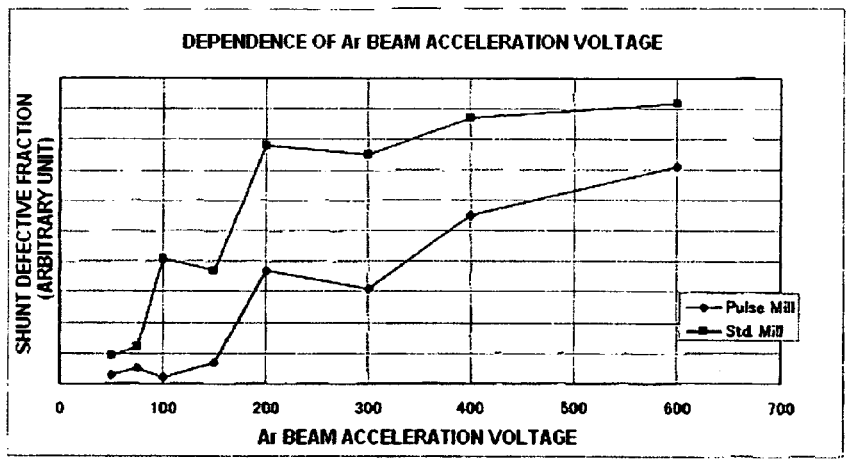

FIG. 15(b) shows the relationship between the acceleration voltage of the Ar ion beam and the shunt defective fraction in the etching method according to embodiments of the present invention and the conventional technique. Although the shunt defective fraction increases if the acceleration voltage of the Ar ion beam is increased, the shunt defective fraction can be reduced even though the acceleration voltage of the Ar ion beam is set to approximately 200V. As understood from FIGS. 15(a) and 15(b), it has been revealed that combination of these conditions and use of the etching method of embodiments of the present invention can reduce the shunt defective fraction drastically.

Figure 16:
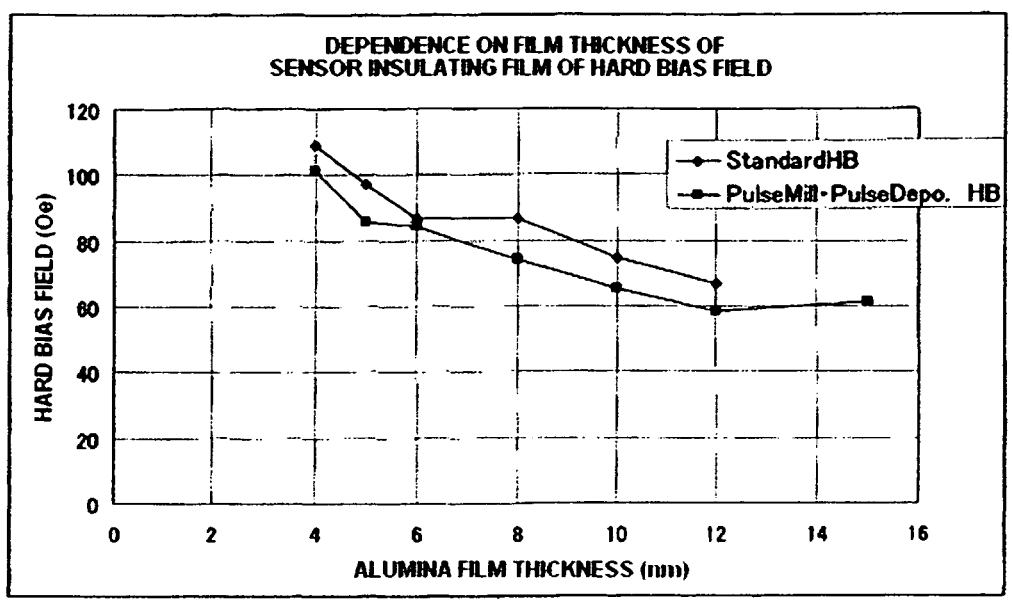
FIG. 16 is a graph showing measurements of the hard bias field applied from the hard bias film to the free layer, selecting alumina for the material of the junction insulating film.

FIG. 16 shows measurements of the hard bias field applied from the hard bias film to the free layer, selecting alumina for the material of the junction insulating film. Comparisons were made between a sample to which the ion milling of embodiments of the present invention and the method for forming the hard bias film according to embodiments of the present invention were applied and a sample to which the conventional method were applied. The film thickness of the sample hard bias film according to the conventional method was set to 35 nm·T in its magnetization amount and the one of the sample hard bias film according to embodiments of the present invention was set to 25 nm·T in its magnetization amount. It has been apparent that, in the sample according to the method of embodiments of the present invention, the equivalent hard bias field to the one in the conventional sample can be applied to the free layer.

In the hard bias film of the sample to which the embodiments of present invention has been applied, the film thickness is thinned by not less than two-thirds, the flatness is enhanced, and the sensor element characteristics are significantly improved.

As set forth above, the present invention is described by way of the preferred embodiments but is not limited to the above embodiments. A person skilled in the art can easily modify, add, and convert the each element in the above embodiments within the scope of the present invention. For example, the stacking order of the layers of the magnetoresistive sensor can be inverted. Embodiments of the present invention are particularly useful for a reproducing head of a magnetic disk device, but can be applicable to another magnetic detection element.

What is claimed is:

1. A magnetic detection element including a magnetoresistive sensor multilayer film having a fixed layer whose magnetization direction is fixed, a free layer whose magnetization direction is changed in accordance with an external magnetic field, and a non-magnetic intermediate layer between the fixed layer and the free layer; current flowing in a perpendicular direction to a plane of the magnetoresistive sensor multilayer film; and the magnetic detection element comprising:
   an upper shield electrode and a lower shield electrode formed so as to sandwich the magnetoresistive sensor multilayer film in the top-bottom direction;
   magnetic domain control films formed at both sides of the magnetoresistive sensor multilayer film for applying bias fields to the free layer;
   a sensor multilayer film lower layer formed lower than the fixed layer, the free layer, and the non-magnetic intermediate layer, and having level differences, thicknesses thereof becoming smaller as getting away from the magnetoresistive sensor multilayer film; and
   insulating films formed in contact with the both side ends of the magnetoresistive sensor multilayer film having level differences such that thicknesses of the insulating films are formed thinner on the magnetoresistive sensor multilayer film side in accordance with the level differences of the sensor multilayer film lower layer,
   wherein the magnetic domain control films have about-horizontally-oriented portions of both upper and lower surfaces thereof positioned vertically above the sensor multilayer film lower layer.

2. The magnetic detection element according to claim 1, wherein angles of end parts of the fixed layer, the free layer, and the non-magnetic intermediate layer are not less than 45°.

3. The magnetic detection element according to claim 1, wherein the upper shield electrode is substantially flat in a region overlapping the magnetoresistive sensor multilayer film; and
   a width of the substantially flat region at a media-facing side of the magnetic detection element is not less than a sum of a track width of the free layer at the media-facing side and a value twice as large as a space between the upper shield electrode and the lower shield electrode.

4. The magnetic detection element according to claim 1, wherein the fixed layer, the non-magnetic intermediate layer, and the free layer are sequentially stacked and arranged in order from the lower side to the upper side;
   the magnetic domain control film has a level difference such that thickness thereof is formed thinner at the magnetoresistive sensor multilayer film side; and
   the level position of the top surface of the magnetic domain control film in a vicinity of a side end of the magnetoresistive sensor multilayer film is lower than the top surface position of the magnetoresistive sensor multilayer film by not more than 5 nm.

5. A magnetic detection element according to claim 1, wherein the magnetic domain control film has a level difference such that thickness thereof is formed thinner at the magnetoresistive sensor multilayer film side; and
   in the level difference of the magnetic domain control film, the thickness of the magnetic domain control film at the magnetoresistive sensor multilayer film side between the about-horizontally-oriented portions of both the upper and lower surfaces of the magnetic domain control film positioned vertically above the sensor multilayer film lower layer is one-half of the thickness of the magnetic domain control film in a portion thereof not positioned vertically above the sensor multilayer film lower layer.

6. The magnetic detection element according to claim 1, wherein an uppermost surface of the sensor multilayer film has a first portion under the fixed layer at a first vertical level, wherein the uppermost surface of the sensor multilayer film has a second portion not under the fixed layer and positioned at a second level lower than the first level, wherein the second portion of the uppermost surface is oriented about parallel to the first portion.

7. A magnetic detection element including a magnetoresistive sensor multilayer film having a fixed layer whose magnetization direction is fixed, a free layer whose magnetization direction is changed in accordance with an external magnetic field, and a non-magnetic intermediate layer between the fixed layer and the free layer; current flowing in a perpendicular direction to a plane of the magnetoresistive sensor multilayer film; and the magnetic detection element comprising:
an upper shield electrode and a lower shield electrode formed so as to sandwich the magnetoresistive sensor multilayer film in the top-bottom direction;
magnetic domain control films formed at both sides of the magnetoresistive sensor multilayer film for applying bias fields to the free layer;
a sensor multilayer film lower layer formed lower than the fixed layer, the free layer, and the non-magnetic intermediate layer, and having level differences, thicknesses thereof becoming smaller as getting away from the magnetoresistive sensor multilayer film, wherein an uppermost surface of the sensor multilayer film has a first portion under the fixed layer at a first vertical level, wherein the uppermost surface of the sensor multilayer film has a second portion not under the fixed layer and positioned at a second level lower than the first level, wherein the second portion of the uppermost surface is oriented about parallel to the first portion; and
insulating films formed in contact with the both side ends of the magnetoresistive sensor multilayer film having level differences such that thicknesses of the insulating films are formed thinner on the magnetoresistive sensor multilayer film side in accordance with the level differences of the sensor multilayer film lower layer.

8. The magnetic detection element according to claim 7, wherein angles of end parts of the fixed layer, the free layer, and the non-magnetic intermediate layer are not less than 45°.

9. The magnetic detection element according to claim 7, wherein the upper shield electrode is substantially flat in a region overlapping the magnetoresistive sensor multilayer film; and
a width of the substantially flat region at a media-facing side of the magnetic detection element is not less than a sum of a track width of the free layer at the media-facing side and a value twice as large as a space between the upper shield electrode and the lower shield electrode.

10. The magnetic detection element according to claim 7, wherein the fixed layer, the non-magnetic intermediate layer, and the free layer are sequentially stacked and arranged in order from the lower side to the upper side;
the magnetic domain control film has a level difference such that thickness thereof is formed thinner at the magnetoresistive sensor multilayer film side; and
the level position of the top surface of the magnetic domain control film in a vicinity of a side end of the magnetoresistive sensor multilayer film is lower than the top surface position of the magnetoresistive sensor multilayer film by not more than 5 nm.

11. A magnetic detection element according to claim 7, wherein the magnetic domain control film has a level difference such that thickness thereof is formed thinner at the magnetoresistive sensor multilayer film side; and
in the level difference of the magnetic domain control film, the thickness at the magnetoresistive sensor multilayer film side is one-half of the thickness of an opposite side of the magnetoresistive sensor multilayer film side.

* * * * *

UNITED STATES PATENT AND TRADEMARK OFFICE
CERTIFICATE OF CORRECTION

PATENT NO. : 8,432,646 B2
APPLICATION NO. : 12/012635
DATED : April 30, 2013
INVENTOR(S) : Kojima et al.

It is certified that error appears in the above-identified patent and that said Letters Patent is hereby corrected as shown below:

On the title page, item 75:

In the inventors list replace "Shuuichi Kojima" with --Shuichi Kojima--.

Signed and Sealed this
Twenty-fifth Day of June, 2013

Teresa Stanek Rea
*Acting Director of the United States Patent and Trademark Office*